United States Patent
Kajiyama et al.

(10) Patent No.: US 8,203,193 B2
(45) Date of Patent: Jun. 19, 2012

(54) MAGNETIC RANDOM ACCESS MEMORY AND MANUFACTURING METHOD OF THE SAME

(75) Inventors: Takeshi Kajiyama, Yokohama (JP); Yoshiaki Asao, Sagamihara (JP); Akihiro Nitayama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/163,349

(22) Filed: Jun. 17, 2011

(65) Prior Publication Data

US 2011/0248365 A1    Oct. 13, 2011

Related U.S. Application Data

(62) Division of application No. 11/943,112, filed on Nov. 20, 2007, now abandoned.

(30) Foreign Application Priority Data

Nov. 21, 2006    (JP) ................................ 2006-314127

(51) Int. Cl.
*H01L 29/82* (2006.01)
*G11C 11/00* (2006.01)
*G11C 11/14* (2006.01)

(52) U.S. Cl. ................ 257/421; 257/E29.323; 365/158; 365/171

(58) Field of Classification Search .......... 257/421–422, 257/E29.323; 365/158, 171
See application file for complete search history.

(56) References Cited

U.S. PATENT DOCUMENTS

| 7,508,699 | B2 * | 3/2009 | Hwang et al. | ................. | 365/158 |
| 7,522,447 | B2 * | 4/2009 | Jeong et al. | .................... | 365/158 |
| 7,548,449 | B2 * | 6/2009 | Kim et al. | ....................... | 365/158 |
| 7,629,637 | B2 | 12/2009 | Kajiyama et al. | | |
| 7,897,950 | B2 * | 3/2011 | Shoji | ................................. | 257/2 |
| 2005/0040447 | A1 | 2/2005 | Fukuzumi | | |
| 2005/0078510 | A1 | 4/2005 | Jeong et al. | | |
| 2005/0146955 | A1 | 7/2005 | Kajiyama | | |
| 2005/0158882 | A1 | 7/2005 | Hwang et al. | | |
| 2006/0062044 | A1 | 3/2006 | Jeong et al. | | |
| 2006/0097333 | A1 | 5/2006 | Jeong et al. | | |

FOREIGN PATENT DOCUMENTS

| JP | 2004-146821 | 5/2004 |
| JP | 2005-340300 | 12/2005 |
| JP | 2006-120742 | 5/2006 |

* cited by examiner

*Primary Examiner* — Anh Phung
*Assistant Examiner* — Allison P Bernstein
(74) *Attorney, Agent, or Firm* — Oblon, Spivak, McClelland, Maier & Neustadt, L.L.P.

(57) ABSTRACT

A magnetic random access memory includes a magnetoresistive effect element which has a fixed layer, a recording layer and a non-magnetic layer provided between the fixed layer and the recording layer and in which the magnetization directions of the fixed layer and the recording layer are brought into a parallel state or an anti-parallel state in accordance with a direction of a current flowing between the fixed layer and the recording layer, a first contact which is connected to the recording layer and in which a contact area between the recording layer and the first contact is smaller than an area of the recording layer, and a cap layer which is provided between the first contact and the recording layer and which directly comes in contact with the first contact and which has a resistance higher than a resistance of the recording layer.

2 Claims, 21 Drawing Sheets

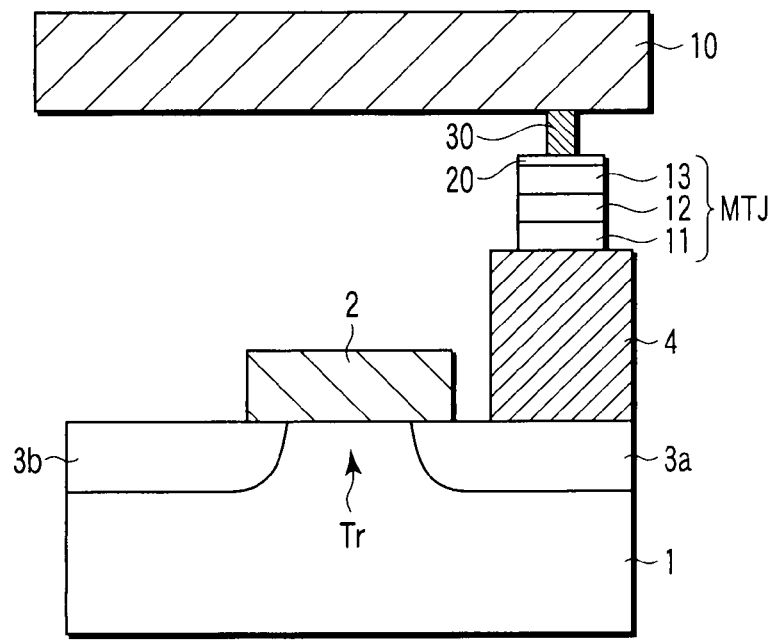
F I G. 1
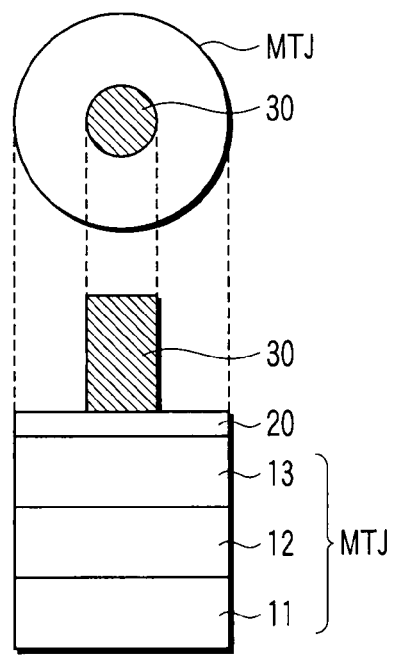
F I G. 2

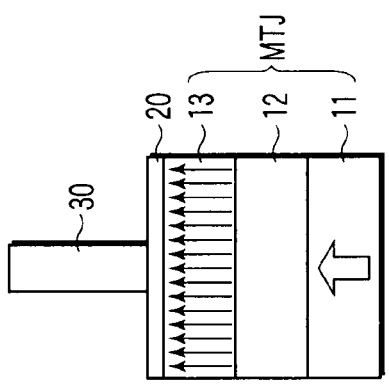
FIG. 4A "0" data (Parallel state)
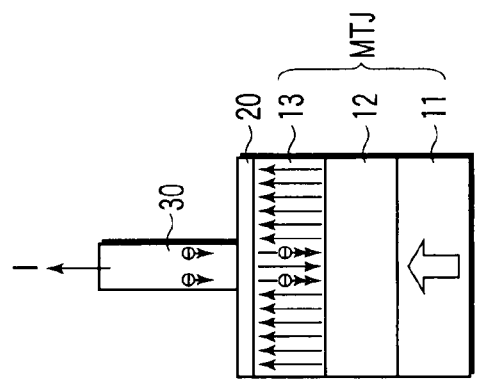
FIG. 4B
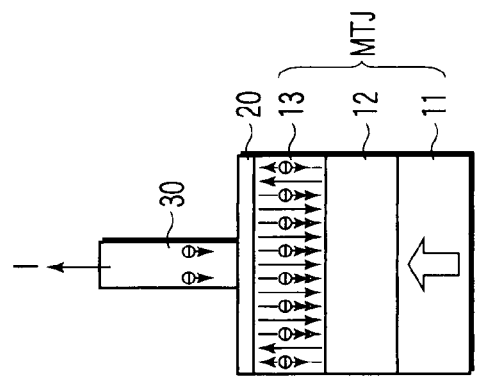
FIG. 4C
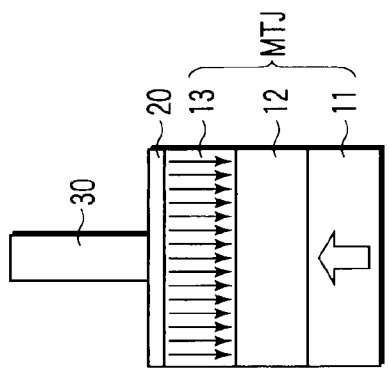
FIG. 4D "1" data (Anti-parallel state)

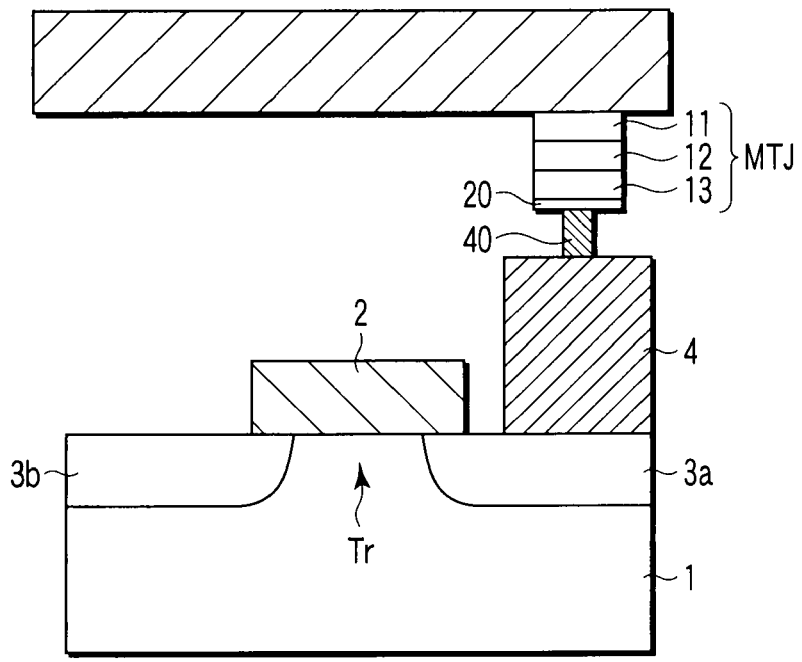
F I G. 5
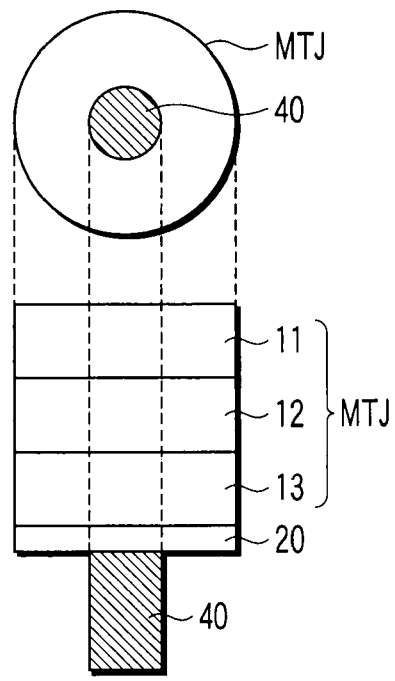
F I G. 6

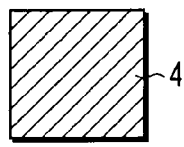
FIG. 7A
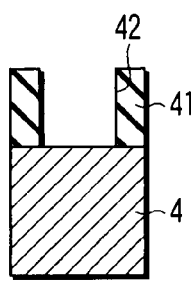
FIG. 7B
FIG. 7C
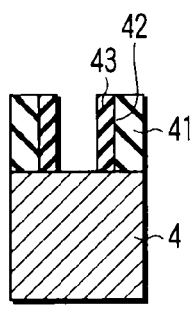
FIG. 7D
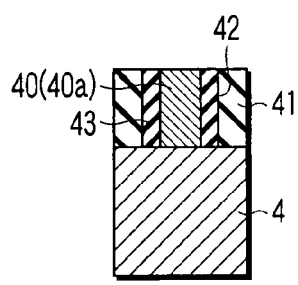
FIG. 7E
FIG. 7F
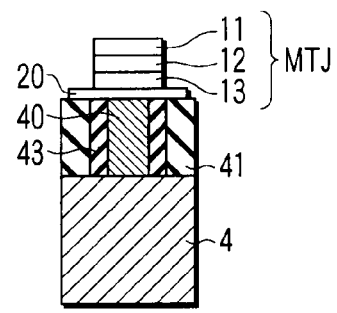
FIG. 7G
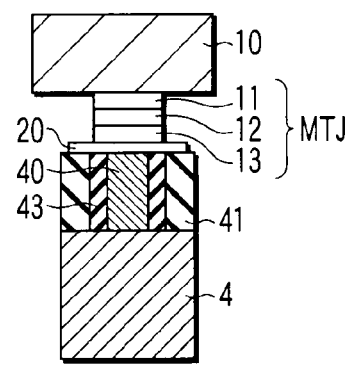
FIG. 7H

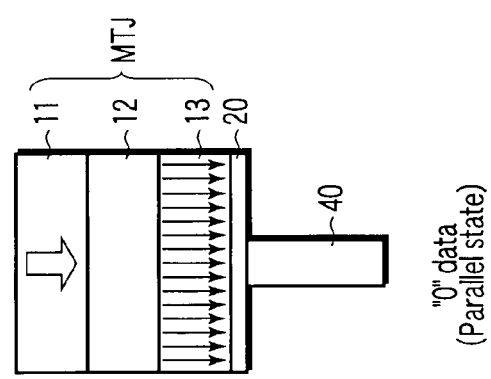
F I G. 8D  "1" data (Anti-parallel state)
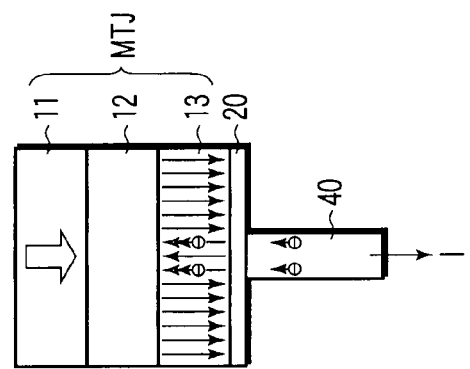
F I G. 8C
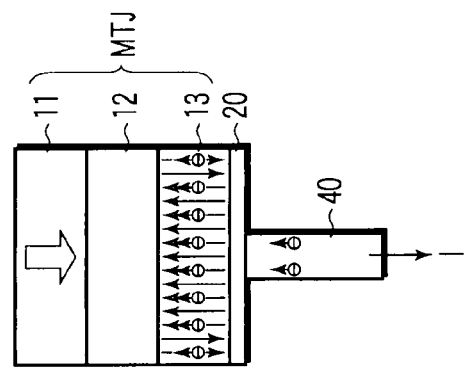
F I G. 8B
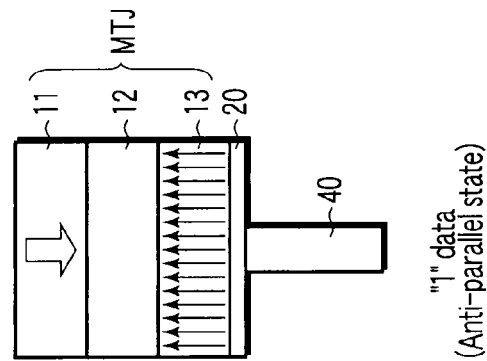
F I G. 8A  "0" data (Parallel state)

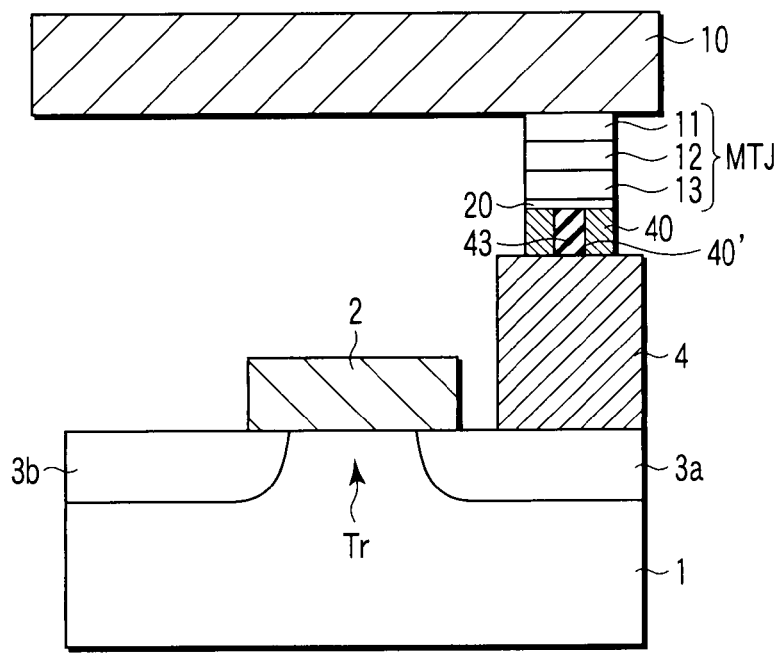
F I G. 12
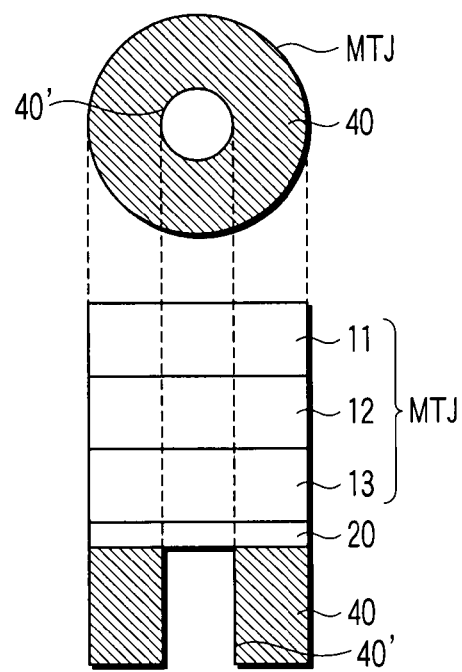
F I G. 13

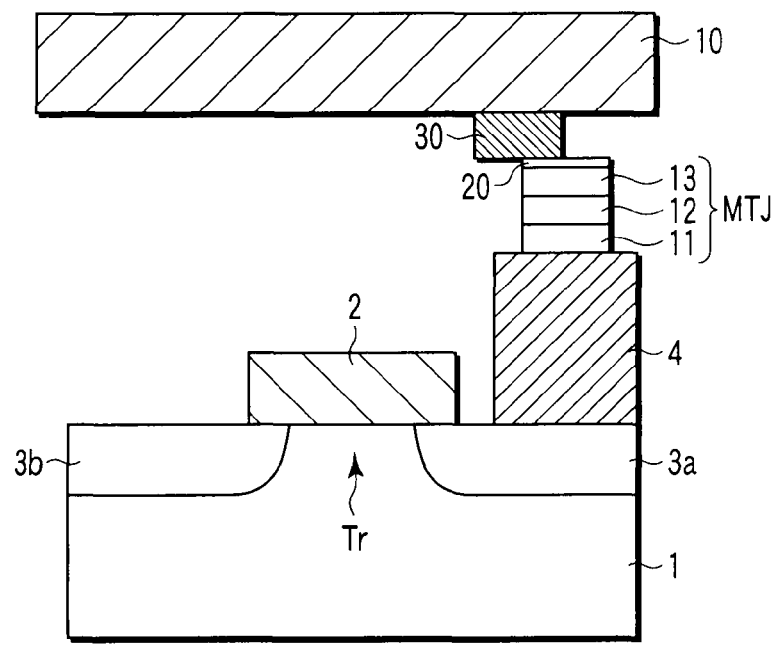
F I G. 15
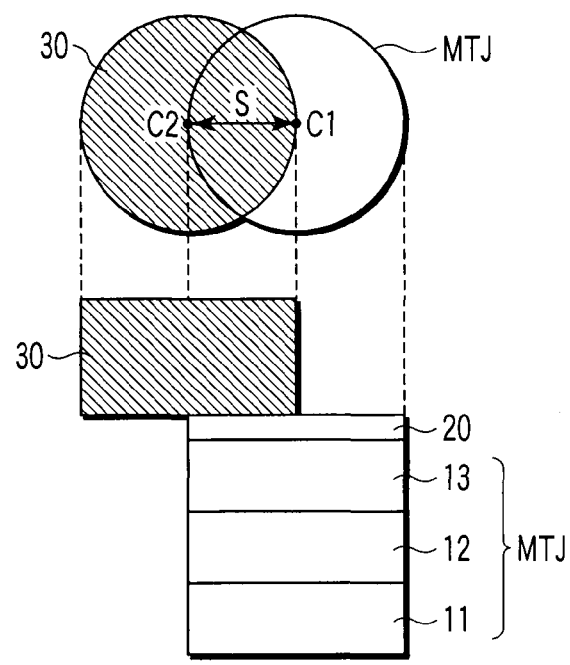
F I G. 16

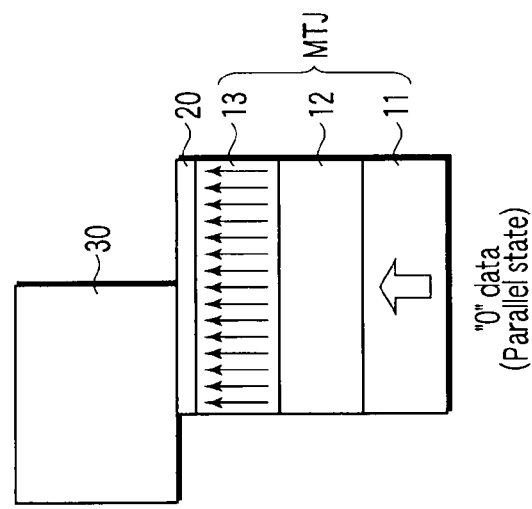
FIG. 17A "0" data (Parallel state)
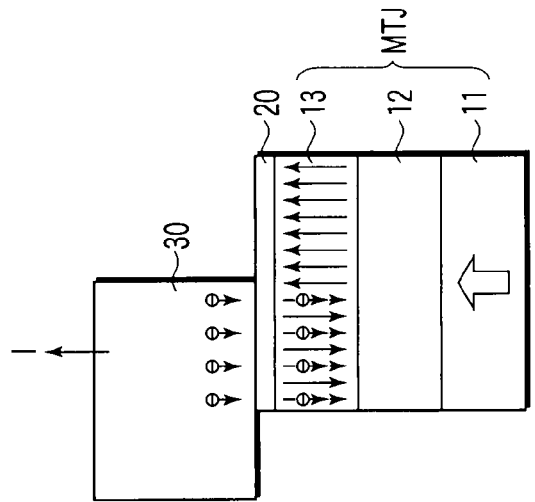
FIG. 17B
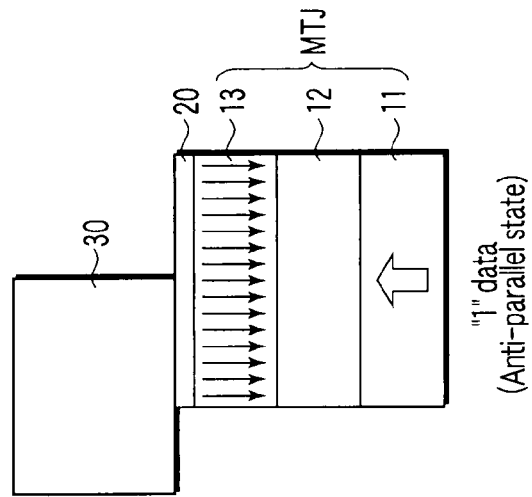
FIG. 17C "1" data (Anti-parallel state)

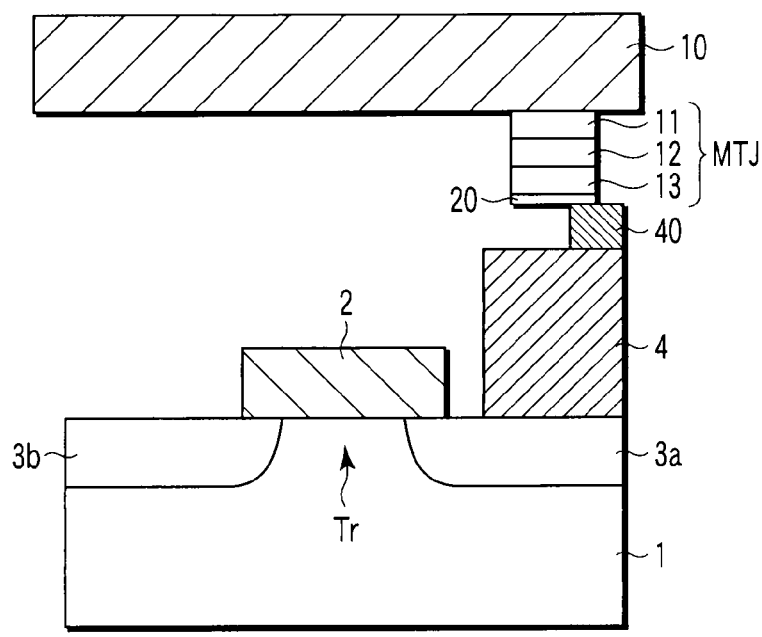
F I G. 18
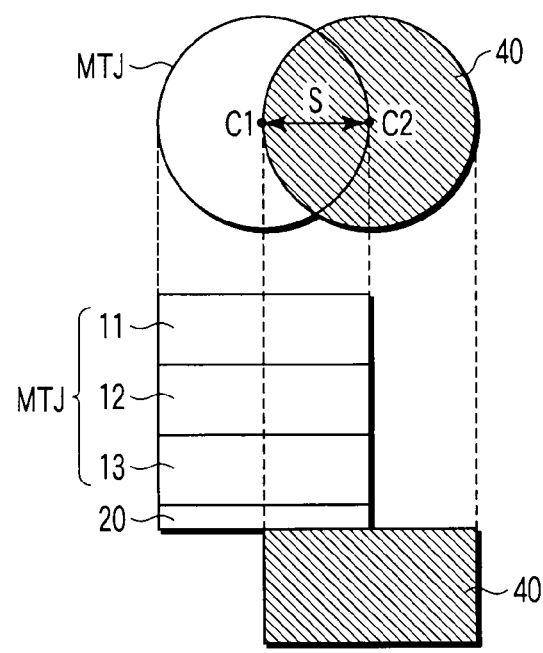
F I G. 19

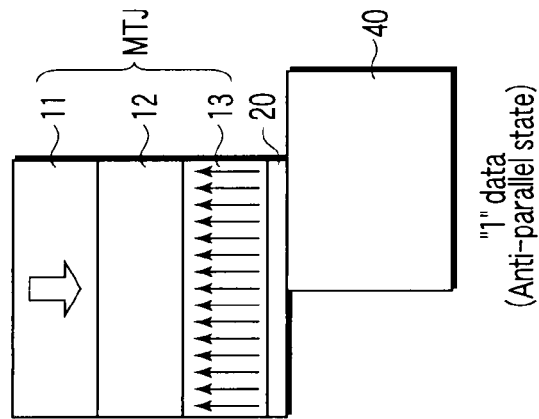
FIG. 20C "1" data (Anti-parallel state)
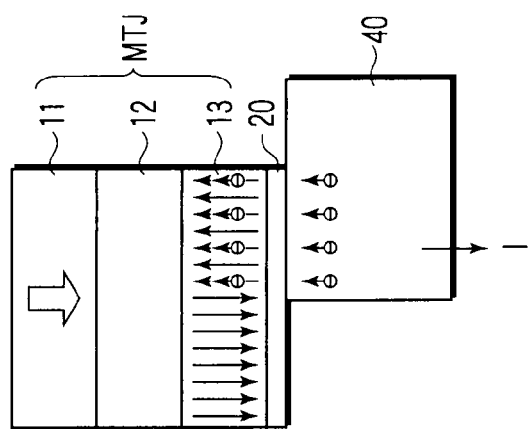
FIG. 20B
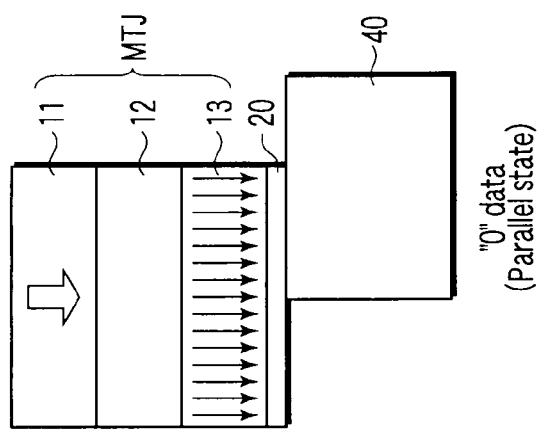
FIG. 20A "0" data (Parallel state)

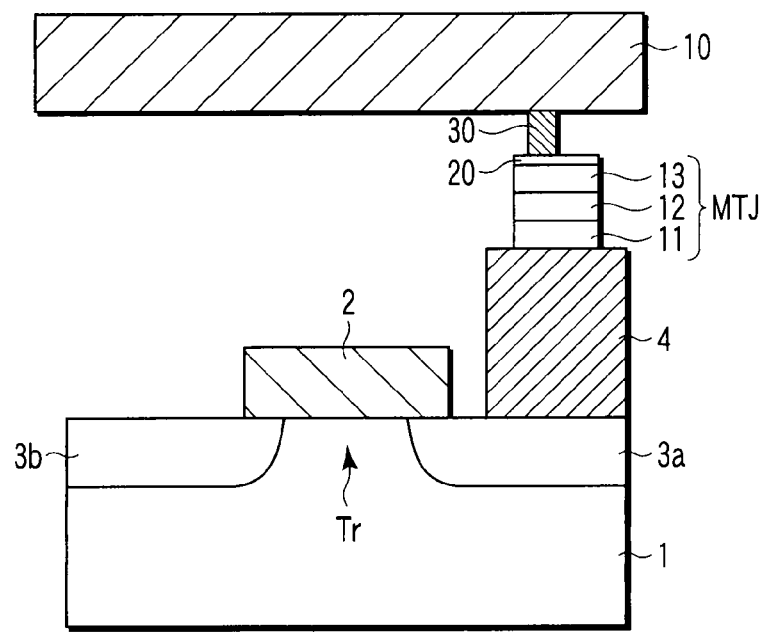
F I G. 21
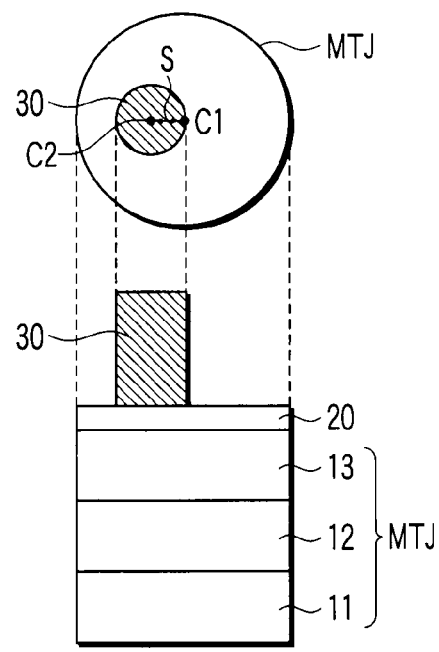
F I G. 22

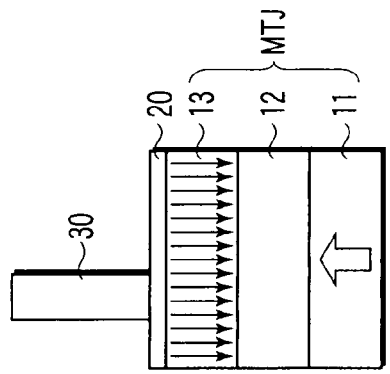
F I G. 23D "1" data (Anti-parallel state)
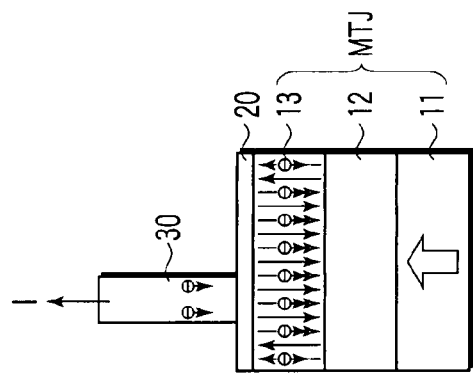
F I G. 23C
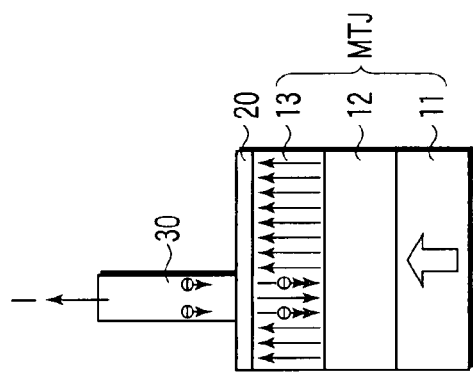
F I G. 23B
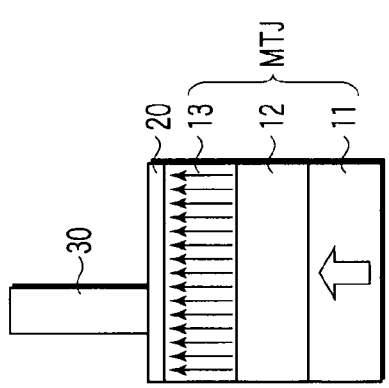
F I G. 23A "0" data (Parallel state)

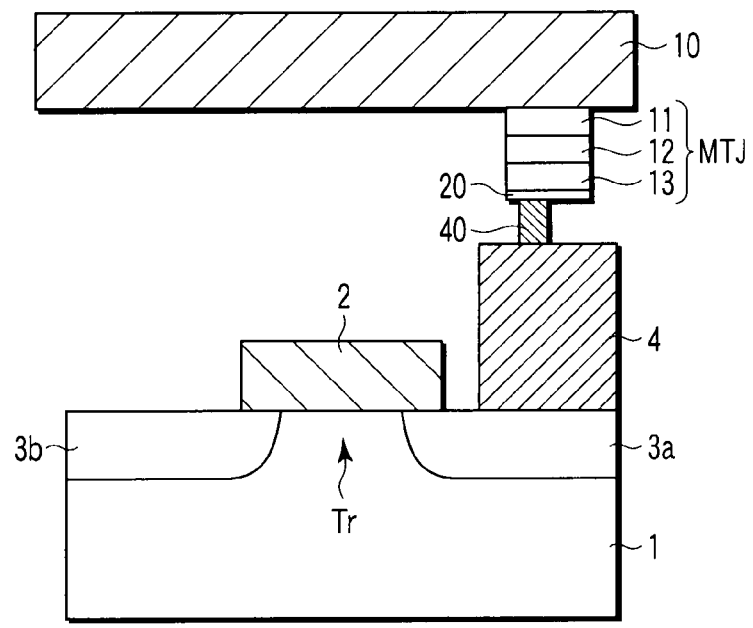
F I G. 24
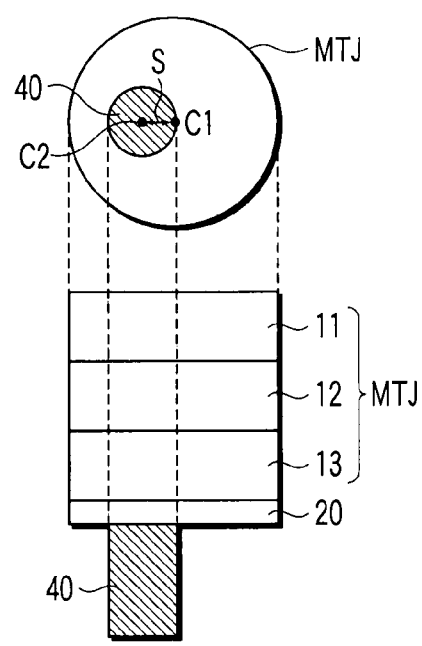
F I G. 25

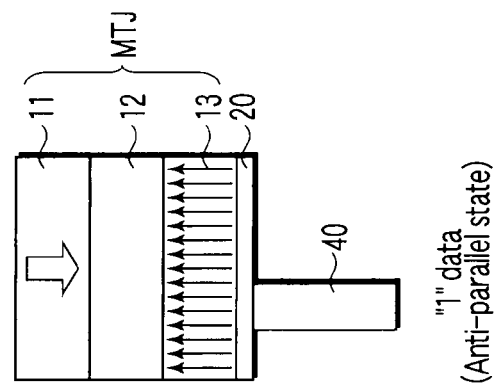
FIG. 26D "1" data (Anti-parallel state)
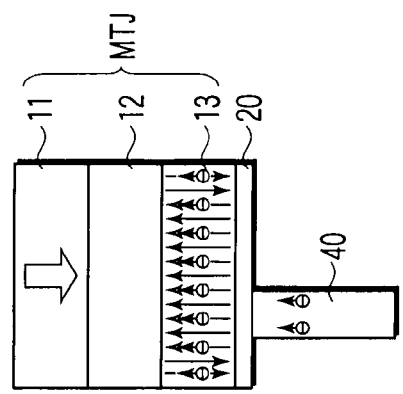
FIG. 26C
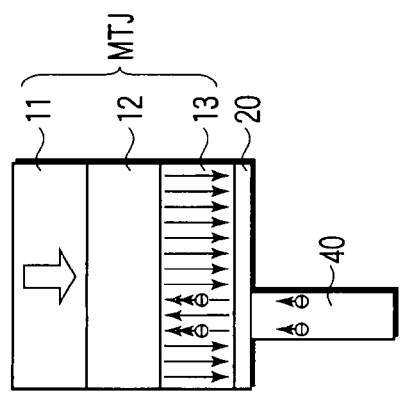
FIG. 26B
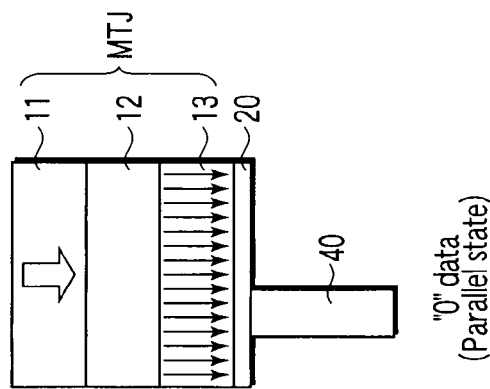
FIG. 26A "0" data (Parallel state)

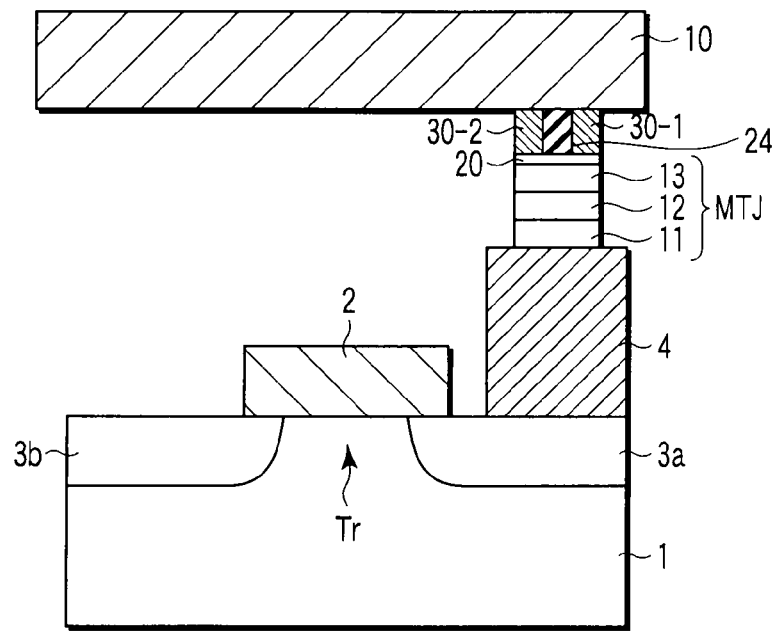
F I G. 27
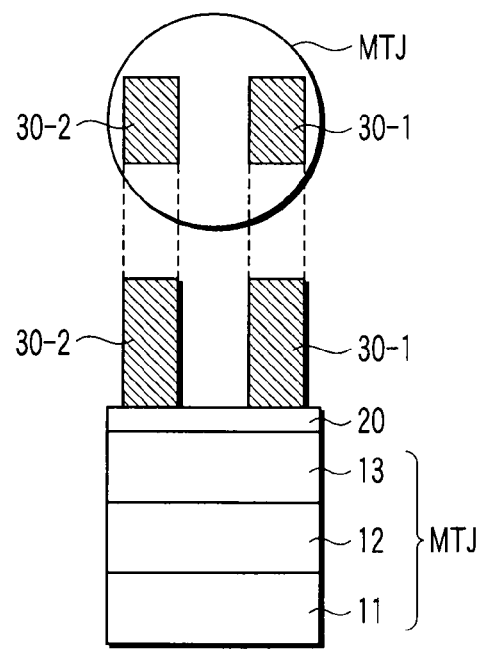
F I G. 28

MAGNETIC RANDOM ACCESS MEMORY AND MANUFACTURING METHOD OF THE SAME

CROSS-REFERENCE TO RELATED APPLICATIONS

This application is a division of and claims the benefit of priority under 35 U.S.C. §120 from U.S. Ser. No. 11/943,112 filed Nov. 20, 2007, and claims the benefit of priority under 35 U.S.C. §119 from Japanese Patent Application No. 2006-314127 filed Nov. 21, 2006, the entire contents of each of which are incorporated herein by reference.

BACKGROUND OF THE INVENTION

1. Field of the Invention

The present invention relates to a magnetic random access memory (MRAM) of a spin injection magnetization reverse type, and a manufacturing method of the memory.

2. Description of the Related Art

In recent years, a magnetic random access memory (MRAM) of a spin injection magnetization reverse type has been expected as a low-current MRAM technology of the next generation.

In the spin injection magnetization reverse type, for example, a structure of a 1Tr+1MTJ type is employed. In this structure of the 1Tr+1MTJ type, an interconnect is connected to one end of a magnetic tunnel junction (MTJ) element via a contact, and a transistor is connected to the other end of the MTJ element. Here, the contact largely comes into contact with the MTJ element. This is because the MTJ element having a small area is assumed to reduce the current of spin injection writing.

However, to reverse magnetization of the MTJ element, spin electrons required for reversing the whole magnetization of the MTJ element need to be injected thereinto from a contact which is larger than the MTJ element. Therefore, lowering of the current of the memory can be realized. However, an amount of the current flowing through one MTJ element and one transistor increases, and this fact has been inconvenient from a viewpoint of cell design.

It is to be noted that prior art document information concerned with the invention of this application is as follows:

[Patent Document 1] Jpn. Pat. Appln. KOKAI Publication No. 2005-340300;
[Patent Document 2] Jpn. Pat. Appln. KOKAI Publication No. 2004-146821; and
[Patent Document 3] Jpn. Pat. Appln. KOKAI Publication No. 2006-120742.

BRIEF SUMMARY OF THE INVENTION

A magnetic random access memory according to a first aspect of the present invention comprises a magnetoresistive effect element which includes a fixed layer having a fixed magnetization direction, a recording layer having a reversible magnetization direction and a non-magnetic layer provided between the fixed layer and the recording layer and in which the magnetization directions of the fixed layer and the recording layer are brought into a parallel state or an anti-parallel state in accordance with a direction of a current which flows between the fixed layer and the recording layer; a first contact which is connected to the recording layer and in which a contact area between the recording layer and the first contact is smaller than an area of the recording layer; and a cap layer which is provided between the first contact and the recording layer and which directly comes in contact with the first contact and which has a resistance higher than a resistance of the recording layer.

A magnetic random access memory manufacturing method according to a second aspect of the present invention comprises forming a magnetoresistive effect element having a fixed layer having a fixed magnetization direction, a recording layer having a reversible magnetization direction and a non-magnetic layer provided between the fixed layer and the recording layer; forming a first insulating film on the magnetoresistive effect element; covering the first insulating film with a second insulating film and removing the second insulating film until the first insulating film is exposed; removing the first insulating film to form a groove; forming a third insulating film only on a side surface of the groove; and forming a contact in the groove, a contact area between the contact and the magnetoresistive effect element being smaller than an area of the magnetoresistive effect element.

A magnetic random access memory manufacturing method according to a third aspect of the present invention comprises forming a magnetoresistive effect element having a fixed layer having a fixed magnetization direction, a recording layer having a reversible magnetization direction and a non-magnetic layer provided between the fixed layer and the recording layer; forming a first insulating film on the magnetoresistive effect element; covering the first insulating film with a second insulating film and removing the second insulating film until the first insulating film is exposed; removing the first insulating film to form a groove; forming a contact having a hollow portion at the center thereof only on a side surface of the groove, a contact area between the contact and the magnetoresistive effect element being smaller than an area of the magnetoresistive effect element; and forming a third insulating film at the hollow portion.

BRIEF DESCRIPTION OF THE SEVERAL VIEWS OF THE DRAWING

FIG. 1 is a sectional view showing a magnetic random access memory according to a first embodiment of the present invention;

FIG. 2 shows a plan view and a sectional view in which a connecting portion between an MTJ element and a contact shown in FIG. 1 is enlarged;

FIGS. 4A to 4D are explanatory views of a write operation of the magnetic random access memory according to the first embodiment of the present invention;

FIG. 5 is a sectional view showing a magnetic random access memory according to a second embodiment of the present invention;

FIG. 6 shows a plan view and a sectional view in which a connecting portion between an MTJ element and a contact shown in FIG. 5 is enlarged;

FIGS. 7A to 7H are sectional views showing manufacturing steps of the magnetic random access memory according to the second embodiment of the present invention;

FIGS. 8A to 8D are explanatory views of a write operation of the magnetic random access memory according to the second embodiment of the present invention;

FIG. 12 is a sectional view showing a magnetic random access memory according to a fourth embodiment of the present invention;

FIG. 13 shows a plan view and a sectional view in which a connecting portion between an MTJ element and a contact shown in FIG. 12 is enlarged;

FIG. 15 is a sectional view showing a magnetic random access memory according to a fifth embodiment of the present invention;

FIG. 16 shows a plan view and a sectional view in which a connecting portion between an MTJ element and a contact shown in FIG. 15 is enlarged;

FIGS. 17A to 17C are explanatory views of a write operation of the magnetic random access memory according to the fifth embodiment of the present invention;

FIG. 18 is a sectional view showing a magnetic random access memory according to a sixth embodiment of the present invention;

FIG. 19 shows a plan view and a sectional view in which a connecting portion between an MTJ element and a contact shown in FIG. 18 is enlarged;

FIGS. 20A to 20C are explanatory views of a write operation of the magnetic random access memory according to the sixth embodiment of the present invention;

FIG. 21 is a sectional view showing a magnetic random access memory according to a seventh embodiment of the present invention;

FIG. 22 shows a plan view and a sectional view in which a connecting portion between an MTJ element and a contact shown in FIG. 21 is enlarged;

FIGS. 23A to 23D are explanatory views of a write operation of the magnetic random access memory according to the seventh embodiment of the present invention;

FIG. 24 is a sectional view showing a magnetic random access memory according to an eighth embodiment of the present invention;

FIG. 25 shows a plan view and a sectional view in which a connecting portion between an MTJ element and a contact shown in FIG. 24 is enlarged;

FIGS. 26A to 26D are explanatory views of a write operation of the magnetic random access memory according to the eighth embodiment of the present invention;

FIG. 27 is a sectional view showing a magnetic random access memory according to a ninth embodiment of the present invention;

FIG. 28 shows a plan view and a sectional view in which a connecting portion between an MTJ element and a contact shown in FIG. 27 is enlarged;

DETAILED DESCRIPTION OF THE INVENTION

Figure 3A:
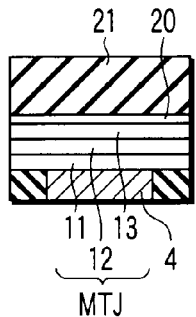
FIGS. 3A to 3J are sectional views showing manufacturing steps of the magnetic random access memory according to the first embodiment of the present invention.

Embodiments of the present invention will hereinafter be described with reference to the drawings. In the description, portions common to all the drawings are denoted with common reference numbers.

[1] Magnetic Random Access Memory

In a magnetic random access memory (MRAM) according to the embodiment of the present invention, a contact area of a contact is smaller than an area of a magnetic tunnel junction (MTJ) element as a magnetoresistive effect element, at a portion where the MTJ element comes in contact with the contact.

[1-1] First Embodiment

A first embodiment relates to a contact positioned above an MTJ element, and is an example in which this contact is formed to be thin, whereby a contact area of the contact with respect to a recording layer is set to be smaller than an area of the recording layer.

(Structure)

FIG. 1 shows a sectional view of a magnetic random access memory according to the first embodiment of the present invention. FIG. 2 shows a plan view and a sectional view in which a connecting portion between the MTJ element and the contact shown in FIG. 1 is enlarged. The magnetic random access memory according to the first embodiment of the present invention will hereinafter be described.

As shown in FIG. 1, a gate electrode 2 is formed on a semiconductor substrate (a silicon substrate) 1 via a gate insulating film (not shown), and source/drain dispersion layers 3a, 3b are formed in the semiconductor substrate 1 on opposite sides of this gate electrode 2 to form a transistor (e.g., an MOS transistor) Tr which functions as a switching unit.

A contact 4 is connected to the source/drain dispersion layer 3a of the transistor Tr, and an MTJ element MTJ is formed on this contact 4. The MTJ element MTJ has a laminated structure in which a fixed layer (a pinned layer) 11, a non-magnetic layer 12 and a recording layer (a free layer) 13 are laminated in order. A cap layer 20 is formed on the MTJ element MTJ, and a contact 30 is directly connected to this cap layer 20. Onto the contact 30, an interconnect 10 is connected. This interconnect 10 is connected to, for example, a power terminal and a ground terminal.

As shown in FIG. 2, the contact 30 is thinner than the MTJ element MTJ. Therefore, an area of a portion in which the contact 30 comes in contact with the recording layer 13 via the cap layer 20 is smaller than that of the recording layer 13. The contact 30 is positioned at the center of the MTJ element MTJ (the recording layer 13). The MTJ element MTJ and the contact 30 have a circular planar shape, and a diameter of the contact 30 is smaller than that of the MTJ element MTJ.

It is preferable that the resistance of the cap layer 20 is, for example, about one digit higher than that of the recording layer 13. Examples of a material of this cap layer 20 include a material of the non-magnetic layer 12 and a barrier metal material having a large sheet resistance. Here, as the material of the non-magnetic layer 12, please refer to paragraphs [2-2]

described later. Examples of the barrier metal material include the following materials (a) to (k):

(a) Ti;

(b) Ta;

(c) Ti-containing compounds (e.g., TiN, TiW, TiSiN, TiSi$_x$, TiB$_2$, TiB and TiC);

(d) Ta-containing compounds (e.g., TaB$_2$, TaB, TaC, TaN, Ta$_4$N$_5$, Ta$_5$N$_6$, and Ta$_2$N);

(e) Zr-containing compounds (e.g., ZrB$_2$, ZrB, ZrC and ZrN);

(f) Hf-containing compounds (e.g., HfB, HfC and HfN);

(g) V-containing compounds (e.g., VB$_2$, VB, VC and VN);

(h) Nb-containing compounds (e.g., NbB$_2$, NbB, NbC and NbN);

(i) Cr-containing compounds (e.g., CrB$_2$, CrB, Cr$_2$B, Cr$_3$C$_2$, Cr$_2$N and CrN);

(j) Mo-containing compounds (e.g., Mo$_2$B$_3$, MoB$_2$, MoB, Mo$_2$B, Mo$_x$C$_y$, Mo$_2$C and MoN); and (k) W-containing compounds (e.g., W$_x$B$_y$, W$_2$B$_5$, W$_x$C$_y$, WC, W$_2$C, W$_x$N$_y$ and WN).

The cap layer 20 preferably has the same planar shape as that of the MTJ element MTJ from a viewpoint of easiness of a process, but it may have a different planar shape. An area of an upper surface (the surface on the side of the contact 30) of the cap layer 20 is preferably larger than that of a bottom surface (the surface on the side of the cap layer 20) of the contact 30.

(Manufacturing Method)

FIGS. 3A to 3J show sectional views of manufacturing steps of the magnetic random access memory according to the first embodiment of the present invention. A manufacturing method of the magnetic random access memory according to the first embodiment of the present invention will hereinafter be described. It is to be noted that steps after forming the contact 4 to be connected to the transistor Tr will be described herein.

First, as shown in FIG. 3A, the fixed layer 11, the non-magnetic layer 12, the recording layer 13, the cap layer 20 and a hard mask 21 are deposited on the contact 4 in order. Here, since the cap layer 20 needs to have a resistance higher than that of the recording layer 13, the cap layer is made of, for example, an AlOx film, a TaN film or a TiN film. The hard mask 21 is made of, for example, a silicon nitride film or the like.

Figure 3D:
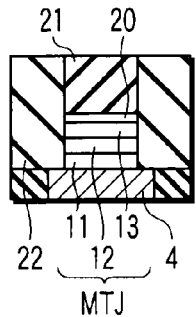
Figure 3G:
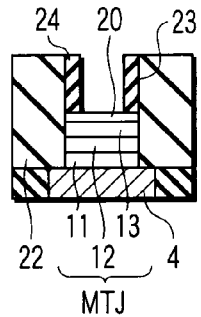
Figure 3J:
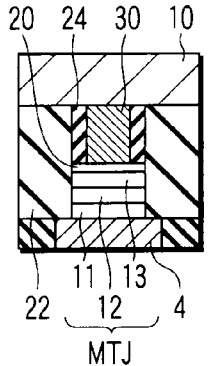
Figure 3B:
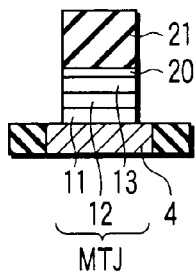

Subsequently, as shown in FIG. 3B, the hard mask 21 is patterned into a desired shape by lithography and reactive ion etching (RIE). Then, the fixed layer 11, the non-magnetic layer 12, the recording layer 13 and the cap layer 20 are etched using this hard mask 21. Consequently, the MTJ element MTJ having the desired shape is formed.

Figure 3E:
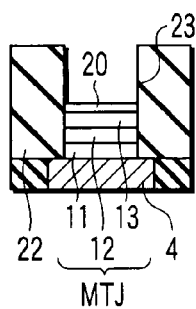
Figure 3H:
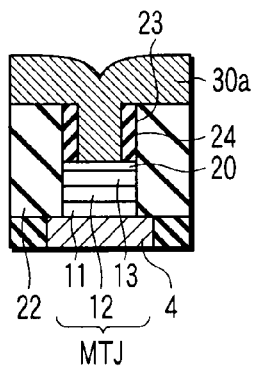
Figure 3C:
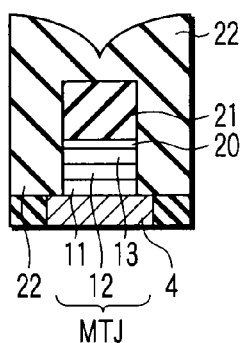

Next, as shown in FIG. 3C, an interlayer insulating film 22 made of, for example, a silicon oxide film is deposited on the hard mask 21. This interlayer insulating film 22 is deposited in such a film thickness as to cover the MTJ element MTJ.

Subsequently, as shown in FIG. 3D, the interlayer insulating film 22 is flattened by chemical mechanical polish (CMP) to expose the hard mask 21. Here, it is preferable that when the hard mask 21 is exposed, a rotation speed of the CMP changes, and hence different materials may be used in the hard mask 21 and the interlayer insulating film 22.

Subsequently, as shown in FIG. 3E, the hard mask 21 is selectively removed to expose the cap layer 20. Consequently, a groove 23 is formed. Since this groove 23 is formed by removing the hard mask 21 used during processing of the MTJ element MTJ, the groove has a size equal to that of the MTJ element MTJ.

Figure 3F:
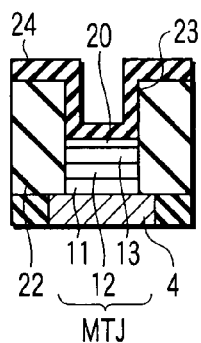

Subsequently, as shown in FIG. 3F, an insulating film 24 made of, for example, a silicon nitride film is deposited in the groove 23. In this case, the insulating film 24 is formed in such a film thickness that the groove 23 is not filled with the insulating film 24. The insulating film 24 is preferably made of a material different from that of the interlayer insulating film 22.

Subsequently, as shown in FIG. 3G, the insulating film 24 on a bottom surface of the groove 23 and the interlayer insulating film 22 is removed by anisotropic etching such as RIE. Consequently, the insulating film 24 is left only on a sidewall of the groove 23.

Subsequently, as shown in FIG. 3H, a barrier metal film (not shown) is deposited in the groove 23, and a conductive film 30a of Cu or the like is formed on this barrier metal film. As a result, the groove 23 is filled up with the conductive film 30a.

Figure 3I:
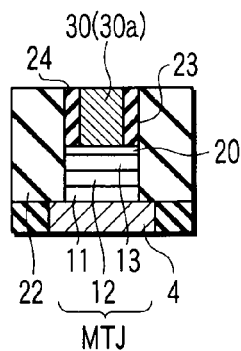

Subsequently, as shown in FIG. 3I, the conductive film 30a and the barrier metal film are flattened by the CMP to expose the interlayer insulating film 22. Consequently, the contact 30 to be connected to the MTJ element MTJ is formed.

Subsequently, as shown in FIG. 3J, an upper interconnect 10 is formed on the contact 30. In this manner, a semiconductor device according to the first embodiment is formed.

According to such a manufacturing method of the first embodiment, after a process of forming a usual contact hole (the groove 23), a process of leaving the insulating film 24 on the sidewall is performed, so that a diameter of the contact 30 can be reduced.

(Write Operation)

FIGS. 4A to 4D show explanatory views of a write operation of the magnetic random access memory according to the first embodiment of the present invention. The write operation of the magnetic random access memory according to the first embodiment of the present invention will hereinafter be described.

In the first embodiment, the write operation using spin injection magnetization reverse is performed. Therefore, in the MTJ element MTJ, magnetization directions of the fixed layer 11 and the recording layer 13 are brought into a parallel state or an anti-parallel state in accordance with a direction of a current I which flows between the fixed layer 11 and the recording layer 13. This specific description is as follows.

In a case where "1" data is written, the current I is passed in a direction from the fixed layer 11 of the MTJ element MTJ to the recording layer 13. That is, electrons e are injected from the side of the recording layer 13 toward the fixed layer 11. Consequently, the fixed layer 11 and the recording layer 13 are magnetized in reverse directions, and they become the anti-parallel state. This high-resistance state Rap is defined as the "1" data.

On the other hand, in a case where "0" data is written, the current I is passed in a direction from the recording layer 13 of the MTJ element MTJ to the fixed layer 11. That is, the electrons e are injected from the side of the fixed layer 11 toward the recording layer 13. Consequently, the fixed layer 11 and the recording layer 13 are magnetized in the same direction, and they become the parallel state. This low-resistance state Rp is defined as the "0" data.

The write operation using such a spin injection magnetization reverse technology is performed in the structure of the first embodiment as follows. It is to be noted that an example where the "1" data is written with respect to the MTJ element MTJ in which the "0" data has been written will be described herein.

First, it is assumed that as shown in FIG. 4A, the recording layer 13 of the MTJ element MTJ is magnetized upwards, and the magnetizations of the fixed layer 11 and the recording layer 13 have the parallel state (a "0" data state). Then, as shown in FIG. 4B, when the write current I is passed in a direction from the fixed layer 11 to the recording layer 13, the magnetization of the recording layer 13 first reverses only at a portion where the write current I (the electrons) flows (a portion which comes in contact with the contact 30). The write current I is passed as it is, whereby as shown in FIG. 4C, propagation is generated in the recording layer 13 owing to current spin, and the magnetization of the recording layer 13 starts reversing in order from the center of the recording layer 13 to an end thereof. As a result, as shown in FIG. 4D, the recording layer 13 is magnetized downwards on the whole, and the magnetizations of the fixed layer 11 and the recording layer 13 become the anti-parallel state (a "1" data state).

In such a write operation, when the contact 30 is processed to be small, the portion where the write current I flows is an only contact portion between the recording layer 13 and the contact 30. Therefore, the write current I can be made low, and there is an advantage that the current flowing through the transistor Tr or the like can be made low.

However, to realize this, it is preferable that the resistance of the cap layer 20 formed in order to protect the MTJ element MTJ is sufficiently higher than that of the recording layer 13. When such a high-resistance cap layer 20 is not disposed, the electrons are propagated to the cap layer 20 faster than to the recording layer 13, and hence the write current I is not concentrated only on a contact portion between the contact 30 and the recording layer 13.

(Read Operation)

In a read operation of the first embodiment, a magnetoresistive effect is used.

The transistor Tr connected to the MTJ element MTJ of a selected cell is turned on, and a read current is passed from, for example, the interconnect 10 to the transistor Tr through the MTJ element MTJ. Then, the "1" data and the "0" data are distinguished by the resistance of the MTJ element MTJ read based on this read current.

It is to be noted that during the read operation, a constant voltage may be applied to read the current, or a constant current may be supplied to read the voltage.

[1-2] Second Embodiment

A second embodiment is an example in which the contact of the first embodiment is arranged under an MTJ element. It is to be noted that in the second embodiment, description of respects similar to those of the other embodiments is omitted.

(Structure)

FIG. 5 shows a sectional view of a magnetic random access memory according to the second embodiment of the present invention. FIG. 6 shows a plan view and a sectional view in which a connecting portion between an MTJ element and a contact is enlarged. The magnetic random access memory according to the second embodiment of the present invention will hereinafter be described.

As shown in FIGS. 5 and 6, the second embodiment is different from the first embodiment in a position of a contact 40 having an area set to be smaller than that of a recording layer 13. That is, in the first embodiment, the contact area of the contact 30 arranged on the side of the interconnect 10 is reduced, whereas in the second embodiment, a contact area of the contact 40 arranged on the side of a transistor Tr is reduced. Furthermore, in the first embodiment, the fixed layer 11 is arranged on the side of the transistor Tr and the recording layer 13 is arranged on the side of the interconnect 10, whereas in the second embodiment, a fixed layer 11 is arranged on the side of an interconnect 10 and the recording layer 13 is arranged on the side of the transistor Tr.

An area of a portion of the contact 40 which comes in contact with the recording layer 13 via a cap layer 20 is smaller than that of the recording layer 13. The contact 40 is positioned at the center of an MTJ element MTJ (the recording layer 13).

The cap layer 20 having a resistance higher than that of the recording layer 13 is formed between the contact 40 and the recording layer 13. A planar shape of the cap layer 20 may be the same as that of the MTJ element MTJ, or may be larger than that of the MTJ element MTJ (see FIG. 7H). It is preferable that an area of a bottom surface (the surface on the side of the contact 40) of the cap layer 20 is larger than that of an upper surface (the surface on the side of the cap layer 20) of the contact 40.

(Manufacturing Method)

FIGS. 7A to 7H show sectional views of manufacturing steps of the magnetic random access memory according to the second embodiment of the present invention. A manufacturing method of the magnetic random access memory according to the second embodiment of the present invention will hereinafter be described. It is to be noted that steps after forming a contact 4 to be connected to the transistor Tr will be described herein.

First, as shown in FIG. 7A, the contact 4 to be connected to a transistor (not shown) is formed on a semiconductor substrate (not shown).

Subsequently, as shown in FIG. 7B, an insulating film 41 made of, for example, a silicon oxide film is formed on the contact 4, and this insulating film 41 is processed. Consequently, a groove 42 is formed so as to expose the contact 4.

Subsequently, as shown in FIG. 7C, an insulating film 43 made of, for example, a silicon nitride film is deposited in the groove 42. In this case, the insulating film 43 is formed in such a film thickness that the groove 42 is not filled with the insulating film 43. The insulating film 43 is preferably made of a material different from that of the insulating film 41.

Subsequently, as shown in FIG. 7D, a bottom surface of the groove 42 and the insulating film 43 on the insulating film 41 are removed by anisotropic etching such as RIE. Consequently, the insulating film 43 is left only on a sidewall of the groove 42.

Subsequently, as shown in FIG. 7E, a barrier metal film (not shown) is deposited in the groove 42, and a conductive film 40a of Cu or the like is formed on this barrier metal film. Afterward, the conductive film 40a and the barrier metal film are flattened by CMP to expose the insulating film 41. Consequently, the contact 40 is formed.

Subsequently, as shown in FIG. 7F, the cap layer 20 is formed on the contact 40, and this cap layer 20 is patterned into a desired shape. Here, since the cap layer 20 needs to have a resistance higher than that of the recording layer 13, the layer is made of, for example, an AlOx film, a TaN film or a TiN film.

Subsequently, as shown in FIG. 7G, on the cap layer 20, the recording layer 13, a non-magnetic layer 12 and the fixed layer 11 are deposited in order. Afterward, the fixed layer 11, the non-magnetic layer 12 and the recording layer 13 are etched. Consequently, the MTJ element MTJ having the desired shape is formed. It is to be noted that the cap layer 20 is not processed in the step of FIG. 7F, and may collectively be processed simultaneously with the MTJ element MTJ in the present step.

Subsequently, as shown in FIG. 7H, an upper interconnect 10 is formed on the MTJ element MTJ. In this manner, a semiconductor device according to the second embodiment is formed.

According to such a manufacturing method of the second embodiment, after a process of forming a usual contact hole (the groove 42), a process of leaving the insulating film 43 on the sidewall is performed, so that a diameter of the contact 40 can be reduced.

Furthermore, in the first embodiment, as shown in FIG. 3G, in the step of leaving the insulating film 24 on the sidewall, the etching of the insulating film 24 needs to be stopped by the cap layer 20, and a magnetic metal of a portion of the MTJ element MTJ which comes in contact with the contact 30 might be damaged. On the other hand, in the second embodiment, in the step of leaving the insulating film 43 on the sidewall, the cap layer 20 does not function as an underlayer, and the MTJ element MTJ is formed above the contact 40, so that there is an advantage that unlike the first embodiment, the magnetic metal might not be damaged.

(Write Operation)

FIGS. 8A to 8D show explanatory views of a write operation of the magnetic random access memory according to the second embodiment of the present invention. The write operation of the magnetic random access memory according to the second embodiment of the present invention will hereinafter be described. It is to be noted that a case where "1" data is written in the MTJ element MTJ in which "0" data has been written will be described as an example herein.

First, it is assumed that as shown in FIG. 8A, the recording layer 13 of the MTJ element MTJ is magnetized downwards, and the magnetizations of the fixed layer 11 and the recording layer 13 have a parallel state (a "0" data state). Then, as shown in FIG. 8B, when a write current I is passed in a direction from the fixed layer 11 to the recording layer 13, the magnetization of the recording layer 13 first reverses only at a portion where the write current I (electrons) flows (a portion which comes in contact with the contact 40). The write current I is passed as it is, whereby as shown in FIG. 8C, propagation is generated in the recording layer 13 owing to current spin, and the magnetization of the recording layer 13 starts reversing in order from the center of the recording layer 13 to an end thereof. As a result, as shown in FIG. 8D, the recording layer 13 is magnetized upwards on the whole, and the magnetizations of the fixed layer 11 and the recording layer 13 have an antiparallel state (a "1" data state).

In such a write operation, when the contact 40 is processed to be small, the portion where the write current I flows is an only contact portion between the recording layer 13 and the contact 40. Therefore, in the same manner as in the first embodiment, the write current I can be made low, and there is an advantage that the current flowing through the transistor Tr or the like can be made low.

[1-3] Third Embodiment

A third embodiment relates to a contact positioned above an MTJ element, and is an example in which this contact is provided with a hollow portion at the center of the contact, whereby a contact area of the contact with respect to a recording layer is set to be smaller than an area of the recording layer. It is to be noted that in the third embodiment, description of respects similar to those of the other embodiments is omitted.

(Structure)

Figure 9:
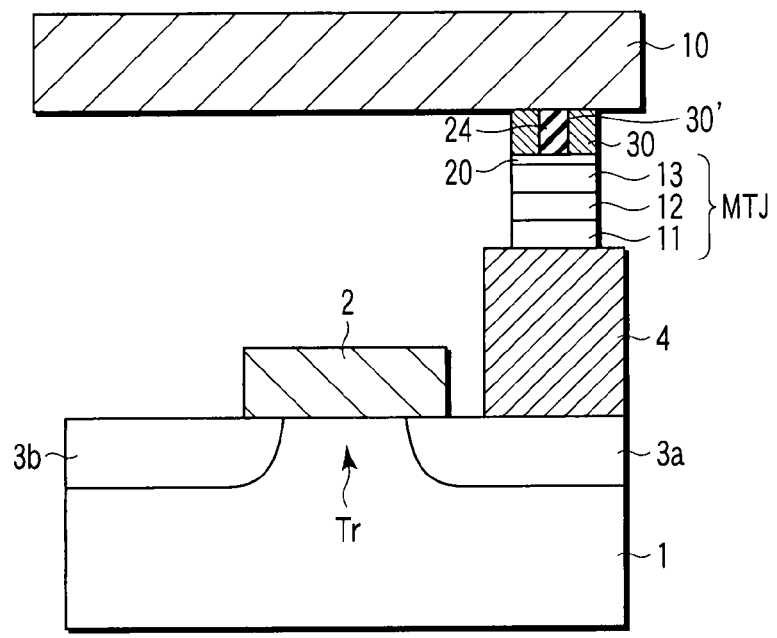
FIG. 9 is a sectional view showing a magnetic random access memory according to a third embodiment of the present invention.
Figure 10:
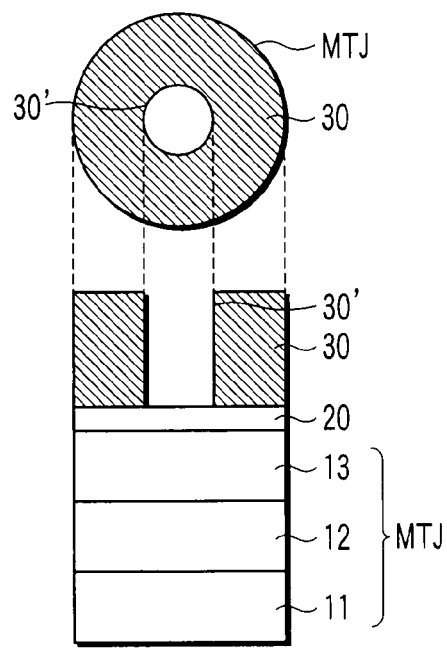
FIG. 10 shows a plan view and a sectional view in which a connecting portion between an MTJ element and a contact shown in FIG. 9 is enlarged.

FIG. 9 shows a sectional view of a magnetic random access memory according to the third embodiment of the present invention. FIG. 10 shows a plan view and a sectional view in which a connecting portion between an MTJ element and a contact of FIG. 9 is enlarged. The magnetic random access memory according to the third embodiment of the present invention will hereinafter be described.

As shown in FIGS. 9 and 10, the third embodiment is different from the first embodiment in a shape of a contact 30 having an area set to be smaller than that of a recording layer 13. That is, to set the contact area of the contact 30 with respect to the recording layer 13 to be smaller than the area of the recording layer 13, in the first embodiment, the contact 30 is thinned, whereas a hollow portion 30' is formed at the center of the contact 30 in the third embodiment.

The contact 30 of the third embodiment is cylindrical, because the hollow portion 30' is present at the center. An insulating film 24 is formed in this hollow portion 30'. As shown in the drawing, an outer side surface of the contact 30 may match with side surfaces of an MTJ element MTJ and a cap layer 20, but may not match with the side surfaces of the MTJ element MTJ and the cap layer 20.

(Manufacturing Method)

FIGS. 11A to 11J show sectional views of manufacturing steps of the magnetic random access memory according to the third embodiment of the present invention. A manufacturing method of the magnetic random access memory according to the third embodiment of the present invention will hereinafter be described. It is to be noted that steps after forming a contact 4 to be connected to a transistor Tr will be described herein.

Figure 11A:
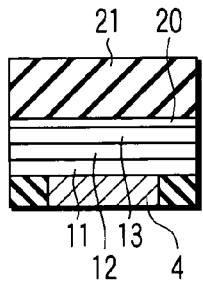
FIGS. 11A to 11J are sectional views showing manufacturing steps of the magnetic random access memory according to the third embodiment of the present invention.

First, as shown in FIG. 11A, on the contact 4, a fixed layer 11, a non-magnetic layer 12, the recording layer 13, the cap layer 20 and a hard mask 21 are deposited in order. Here, since the cap layer 20 needs to have a resistance higher than that of the recording layer 13, the layer is made of, for example, an AlOx film, a TaN film or a TiN film. The hard mask 21 is made of, for example, a silicon nitride film.

Figure 11B:
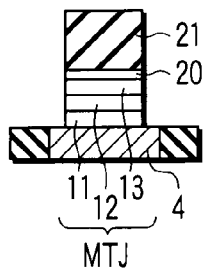

Subsequently, as shown in FIG. 11B, the hard mask 21 is patterned into a desired shape by lithography and RIE. Then, the fixed layer 11, the non-magnetic layer 12, the recording layer 13 and the cap layer 20 are etched using this hard mask 21. Consequently, the MTJ element MTJ having the desired shape is formed.

Figure 11C:
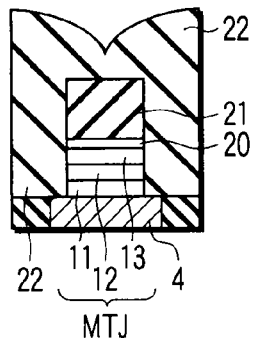

Subsequently, as shown in FIG. 11C, an interlayer insulating film 22 made of, for example, a silicon oxide film is deposited on the hard mask 21. This interlayer insulating film 22 is deposited in such a film thickness as to cover the MTJ element MTJ.

Figure 11D:
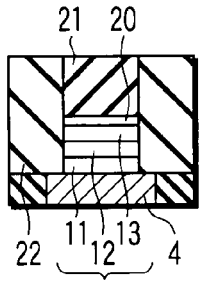

Subsequently, as shown in FIG. 11D, the interlayer insulating film 22 is flattened by CMP to expose the hard mask 21. Here, it is preferable that when the hard mask 21 is exposed, a rotation speed of the CMP changes, and hence different materials may be used in the hard mask 21 and the interlayer insulating film 22.

Figure 11E:
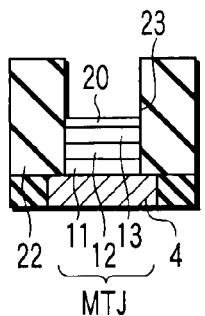

Subsequently, as shown in FIG. 11E, the hard mask 21 is selectively removed to expose the cap layer 20. Consequently, a groove 23 is formed. Since this groove 23 is formed by removing the hard mask 21 used during processing of the MTJ element MTJ, the groove has a size equal to that of the MTJ element MTJ.

Figure 11F:
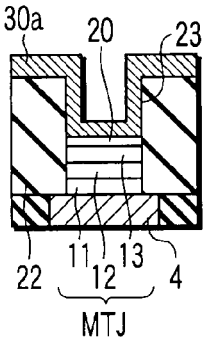

Subsequently, as shown in FIG. 11F, a barrier metal film (not shown) is deposited in the groove 23, and a conductive film 30a of Cu or the like is deposited on this barrier metal film. In this case, the conductive film 30a is formed in such a film thickness that the groove 23 is not filled with the conductive film 30a.

Figure 11G:
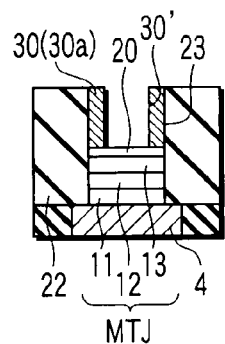

Subsequently, as shown in FIG. 11G, the conductive film 30a on a bottom surface of the groove 23 and the interlayer insulating film 22 is removed by anisotropic etching such as RIE. Consequently, the conductive film 30a is left only on a sidewall of the groove 23, and the contact 30 having the hollow portion 30' is formed.

Figure 11H:
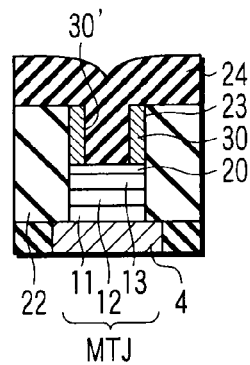

Subsequently, as shown in FIG. 11H, the insulating film 24 made of a silicon nitride film is formed in the hollow portion 30'. Consequently, the hollow portion 30' of the contact 30 is filled up with the insulating film 24. This insulating film 24 is preferably made of a material different from that of the interlayer insulating film 22.

Figure 11I:
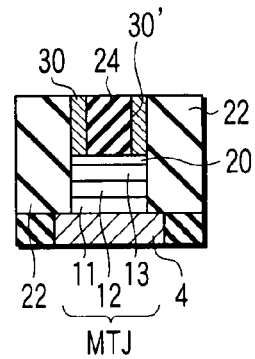

Subsequently, as shown in FIG. 11I, the insulating film 24 is flattened by the CMP to expose the interlayer insulating film 22.

Figure 11J:
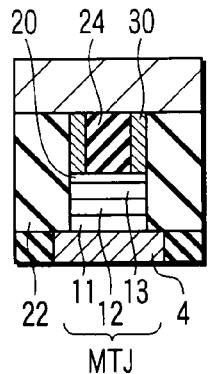

Subsequently, as shown in FIG. 11J, an upper interconnect 10 is formed on the contact 30. In this manner, a semiconductor device according to the third embodiment is formed.

According to such a manufacturing method of the third embodiment, after a process of forming a usual contact hole (the groove 23), a process of leaving the conductive film 30a on the sidewall is performed, so that the contact 30 having the hollow portion 30' can be formed, and a contact area between the contact 30 and the recording layer 13 can be reduced.

Moreover, in the first embodiment, as shown in FIG. 3G, in the process of leaving the insulating film 24 on the sidewall, the etching of the insulating film 24 needs to be stopped by the cap layer 20, and a magnetic metal of a portion of the MTJ element MTJ which comes in contact with the contact 30 might be damaged. On the other hand, in the third embodiment, since the contact 30 itself is formed in the step of leaving the contact on the sidewall, it can be avoided that the magnetic metal of the portion of the MTJ element MTJ which comes in contact with the contact 30 is damaged, so that satisfactory contact can be realized.

It is to be noted that in the present embodiment, write and read operations similar to those of the first embodiment can be realized. Here, in the first embodiment, since a contact portion between the recording layer 13 and the contact 30 is positioned at the center of the recording layer 13, propagation of current spin is generated from the center of the recording layer 13 toward end portions. On the other hand, in the present embodiment, the propagation of the current spin is generated from a periphery of the recording layer 13 toward the center thereof. Therefore, the reverse is carried out from the periphery of the recording layer 13, and hence there are many reverse sources and the magnetization is easily reversed. Owing to the reverse of the magnetization from the periphery of the recording layer 13, an abnormal fixed state of the magnetization which is called Vortex is not easily generated.

[1-4] Fourth Embodiment

A fourth embodiment is an example in which the contact of the third embodiment is arranged under an MTJ element. It is to be noted that in the fourth embodiment, description of respects similar to those of the other embodiments is omitted.

(Structure)

FIG. 12 shows a sectional view of a magnetic random access memory according to the fourth embodiment of the present invention. FIG. 13 shows a plan view and a sectional view in which a connecting portion between the MTJ element and a contact shown in FIG. 12 is enlarged. The magnetic random access memory according to the fourth embodiment of the present invention will hereinafter be described.

As shown in FIGS. 12 and 13, the fourth embodiment is different from the third embodiment in a position of a contact 40 formed to be smaller than an area of a recording layer 13. That is, in the third embodiment, a contact area of the contact 30 arranged on an interconnect 10 side is reduced, whereas in the fourth embodiment, a contact area of the contact 40 arranged on a transistor Tr side is reduced. Furthermore, in the third embodiment, a fixed layer 11 is arranged on the transistor Tr side and the recording layer 13 is arranged on the interconnect 10 side, whereas in the fourth embodiment, the fixed layer 11 is arranged on the interconnect 10 side and the recording layer 13 is arranged on the transistor Tr side.

The contact 40 of the fourth embodiment is cylindrical, because a hollow portion 40' is present at the center of the contact. An insulating film 43 is formed in this hollow portion 40'. An outer side surface of the contact 40 may match with side surfaces of an MTJ element MTJ and a cap layer 20 (see FIGS. 12 and 13), or may not match with the side surfaces of the MTJ element MTJ and the cap layer 20. For example, the side surface of the cap layer 20 may protrude from the outer side surface of the contact 40 (see FIG. 14G).

(Manufacturing Method)

FIGS. 14A to 14H show sectional views of manufacturing steps of the magnetic random access memory according to the fourth embodiment of the present invention. A manufacturing method of the magnetic random access memory according to the fourth embodiment of the present invention will hereinafter be described. It is to be noted that steps after forming a contact 4 to be connected to the transistor Tr will be described herein.

Figure 14A:
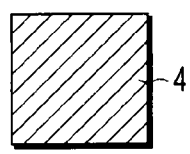
FIGS. 14A to 14H are sectional views showing manufacturing steps of the magnetic random access memory according to the fourth embodiment of the present invention.

First, as shown in FIG. 14A, the contact 4 to be connected to a transistor (not shown) is formed on a semiconductor substrate (not shown).

Figure 14B:
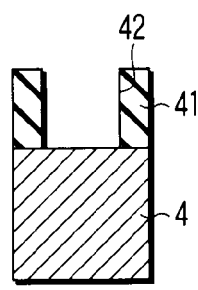

Subsequently, as shown in FIG. 14B, an insulating film 41 made of, for example, a silicon oxide film is formed on the contact 4, and this insulating film 41 is processed. Consequently, a groove 42 is formed to expose the contact 4.

Figure 14C:
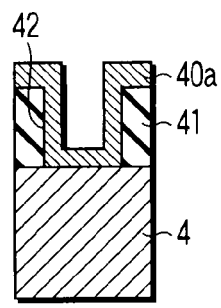

Subsequently, as shown in FIG. 14C, a barrier metal film (not shown) is deposited in the groove 42, and a conductive film 40a of Cu or the like is formed on this barrier metal film.

Figure 14D:
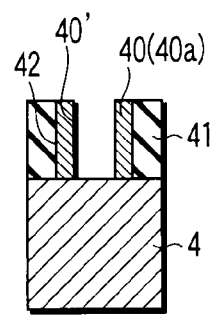

Subsequently, as shown in FIG. 14D, the barrier metal film and the conductive film 40a on the contact 4 and the insulating film 41 are removed by anisotropic etching such as RIE. Consequently, the contact 40 having the hollow portion 40' is formed.

Figure 14E:
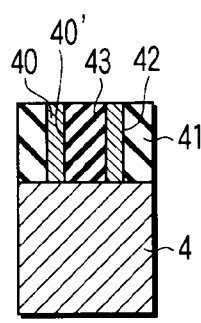

Subsequently, as shown in FIG. 14E, the insulating film 43 made of, for example, a silicon nitride film is deposited in the hollow portion 40'. Afterward, the insulating film 43 is flattened by CMP to expose the insulating film 41. Here, the insulating film 43 is preferably made of a material different from that of the insulating film 41.

Figure 14F:
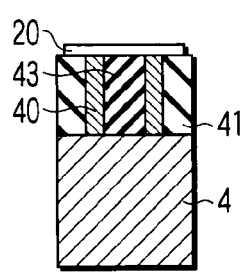

Subsequently, as shown in FIG. 14F, the cap layer 20 is formed on the contact 40, and this cap layer 20 is patterned into a desired shape. Here, since the cap layer 20 needs to have a resistance higher than the recording layer 13, the cap layer is made of, for example, an AlOx film, a TaN film or a TiN film.

Figure 14G:
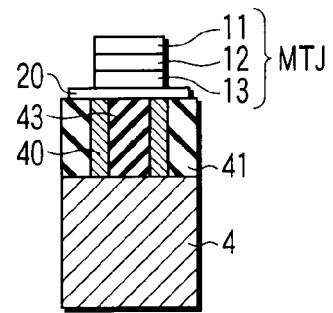

Subsequently, as shown in FIG. 14G, the recording layer 13, a non-magnetic layer 12 and the fixed layer 11 are deposited on the cap layer 20 in order. Afterward, the fixed layer 11, the non-magnetic layer 12 and the recording layer 13 are etched.

Consequently, the MTJ element MTJ having the desired shape is formed. It is to be noted that the cap layer 20 may not be processed in the step of FIG. 14F, and may collectively be processed together with the MTJ element MTJ in the present step.

Figure 14H:
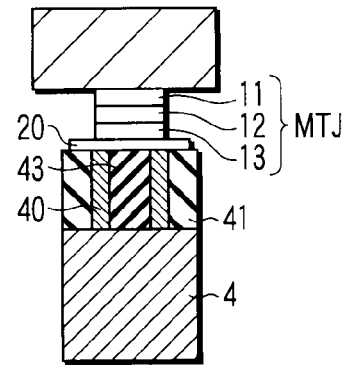

Subsequently, as shown in FIG. 14H, the upper interconnect 10 is formed on the MTJ element MTJ. In this manner, a semiconductor device of the fourth embodiment is formed.

According to the manufacturing method of the fourth embodiment, after a process to form a usual contact hole (the groove 42), a process to leave the conductive film 40a on a sidewall is performed, so that the contact 40 having the hollow portion 40' can be formed, and a contact area between the contact 40 and the recording layer 13 can be reduced.

Moreover, in the fourth embodiment, during the CMP (FIG. 14E) of the insulating film 43 to fill in the hollow portion 40' of the contact 40, the conductive film 40a of the contact 40 can be used as a stopper layer. Therefore, stability of control of the CMP improves, flatness of an underlayer portion of the MTJ element MTJ increases, and deterioration of a magnetic property of the MTJ element MTJ due to fluctuation of an underlayer can be inhibited.

[1-5] Fifth Embodiment

A fifth embodiment relates to a contact positioned above an MTJ element, and is an example in which this contact and the MTJ element are misaligned to set a contact area of the contact with respect to a recording layer to be smaller than an area of the recording layer. It is to be noted that in the fifth embodiment, description of respects similar to those of the other embodiments is omitted.

(Structure)

FIG. 15 shows a sectional view of a magnetic random access memory according to the fifth embodiment of the present invention. FIG. 16 shows a plan view and a sectional view in which a connecting portion between the MTJ element and the contact shown in FIG. 15 is enlarged. The magnetic random access memory according to the fifth embodiment of the present invention will hereinafter be described.

As shown in FIGS. 15 and 16, the fifth embodiment is different from the first embodiment in a method of setting a contact area of a contact 30 with respect to a recording layer 13 to be smaller than an area of the recording layer 13. That is, in the first embodiment, the contact 30 is reduced, whereas in the fifth embodiment, the contact 30 itself is not reduced, and center C2 of the contact 30 is arranged to sift from center C1 of an MTJ element MTJ.

The area of the contact 30 of the fifth embodiment is equal to that of the MTJ element MTJ. It is preferable that sift S between the center C2 of the contact 30 and the center C1 of the MTJ element MTJ is ½ or more of a width (e.g., a minimum processing dimension F) of the MTJ element MTJ in a short direction (a magnetization difficult-axis direction). It is to be noted that an accidental misalignment due to usual lithography is about ¼ of the minimum processing dimension F.

According to such a fifth embodiment, the contact 30 is formed in a usual size, and this contact 30 may be formed so as to sift from the MTJ element MTJ. Therefore, as compared with the first embodiment, steps of a sidewall leaving process and the like can be omitted, and hence there is an advantage that processes are facilitated.

(Write Operation)

FIGS. 17A to 17C show explanatory views of a write operation of the magnetic random access memory according to the fifth embodiment of the present invention. The write operation of the magnetic random access memory according to the fifth embodiment of the present invention will hereinafter be described. It is to be noted that a case where "1" data is written in the MTJ element MTJ in which "0" data has been written will be described as an example herein.

First, it is assumed that as shown in FIG. 17A, the recording layer 13 of the MTJ element MTJ is magnetized upwards, and the magnetizations of a fixed layer 11 and the recording layer 13 have a parallel state (a "0" data state). Then, as shown in FIG. 17B, when a write current I is passed in a direction from the fixed layer 11 to the recording layer 13, the magnetization of the recording layer 13 first reverses only at a portion where the write current I (electrons) flows (a portion which comes in contact with the contact 30). The write current I is passed as it is, whereby propagation is generated in the recording layer 13 owing to current spin, and the magnetization of the recording layer 13 starts reversing in order from an end of the recording layer 13 toward the whole layer. As a result, as shown in FIG. 17C, the recording layer 13 is magnetized downwards on the whole, and the magnetizations of the fixed layer 11 and the recording layer 13 have an anti-parallel state (binary 1 state).

In such a write operation, when the contact 30 is misaligned with respect to the MTJ element MTJ, the portion where the write current I flows is an only contact portion between the recording layer 13 and the contact 30. Therefore, in the same manner as in the first embodiment, the write current I can be made low, and there is an advantage that the current flowing through the transistor Tr can be made low.

Moreover, in the first embodiment and the like, since the contact portion between the recording layer 13 and the contact 30 is positioned at the center of the recording layer 13, the propagation of the current spin is generated from the center of the recording layer 13 toward an end portion thereof. On the other hand, since the misalignment is used in the present embodiment, the contact portion between the recording layer 13 and the contact 30 is positioned at the end portion of the recording layer 13. Therefore, in the present embodiment, the propagation of the current spin is generated from the end of the recording layer 13 toward the whole layer. Consequently, fixing of an intermediate state (a state in which an intermediate resistance value is taken from binary resistance values of "1", "0") due to a magnetic domain does not easily occur. Furthermore, in the present embodiment, the contact 30 is easily processed as compared with the first embodiment.

[1-6] Sixth Embodiment

A sixth embodiment is an example in which the contact of the fifth embodiment is arranged under an MTJ element. It is to be noted that in the sixth embodiment, description of respects similar to those of the other embodiments is omitted.

(Structure)

FIG. 18 shows a sectional view of a magnetic random access memory according to the sixth embodiment of the present invention. FIG. 19 shows a plan view and a sectional view in which a connecting portion between the MTJ element and the contact shown in FIG. 18 is enlarged. The magnetic random access memory according to the sixth embodiment of the present invention will hereinafter be described.

As shown in FIGS. 18 and 19, the sixth embodiment is different from the fifth embodiment in a position of a contact 40 to be misaligned with an MTJ element MTJ. That is, in the fifth embodiment, the contact 30 arranged on an interconnect 10 side is misaligned, whereas in the sixth embodiment, the contact 40 arranged on a transistor Tr side is misaligned. Furthermore, in the fifth embodiment, the fixed layer 11 is arranged on the transistor Tr side and the recording layer 13 is arranged on the interconnect 10 side, whereas in the sixth embodiment, a fixed layer 11 is arranged on an interconnect 10 side and a recording layer 13 is arranged on a transistor Tr side.

An area of the contact 40 of the sixth embodiment is equal to that of the MTJ element MTJ. It is preferable that sift S between center C2 of the contact 40 and center C1 of the MTJ element MTJ is, for example, ½ or more of a width (e.g., a minimum processing dimension F) of the MTJ element MTJ in a short direction (a magnetization difficult-axis direction). It is to be noted that an accidental misalignment due to usual lithography is about ¼ of the minimum processing dimension F.

According to such a sixth embodiment, the contact 40 is formed in a usual size, and this contact 40 may be formed so as to sift from the MTJ element MTJ. Therefore, as compared with the second embodiment, steps of a sidewall leaving process and the like can be omitted, and hence there is an advantage that processes are facilitated.

(Write Operation)

FIGS. 20A to 20C show explanatory views of a write operation of the magnetic random access memory according to the sixth embodiment of the present invention. The write operation of the magnetic random access memory according to the sixth embodiment of the present invention will hereinafter be described. It is to be noted that a case where "1" data is written in the MTJ element MTJ in which "0" data has been written will be described as an example herein.

First, it is assumed that as shown in FIG. 20A, the recording layer 13 of the MTJ element MTJ is magnetized downwards, and the magnetizations of the fixed layer 11 and the recording layer 13 have a parallel state (a "0" data state). Then, as shown in FIG. 20B, when a write current I is passed in a direction from the fixed layer 11 to the recording layer 13, the magnetization of the recording layer 13 first reverses only at a portion where the write current I (electrons) flows (a portion which comes in contact with the contact 40). The write current I is passed as it is, whereby propagation is generated in the recording layer 13 owing to current spin, and the magnetization of the recording layer 13 starts reversing in order from an end of the recording layer 13 toward the whole layer. As a result, as shown in FIG. 20C, the recording layer 13 is magnetized upwards on the whole, and the magnetizations of the fixed layer 11 and the recording layer 13 have an anti-parallel state (a "1" data state).

In such a write operation, when the contact 40 is misaligned with respect to the MTJ element MTJ, the portion where the write current I flows is an only contact portion between the recording layer 13 and the contact 40. Therefore, in the same manner as in the second embodiment, the write current I can be made low, and there is an advantage that the current flowing through the transistor Tr can be made low.

Moreover, in the second embodiment and the like, since the contact portion between the recording layer 13 and the contact 40 is positioned at the center of the recording layer 13, the propagation of the current spin is generated from the center of the recording layer 13 toward an end portion thereof. On the other hand, since the misalignment is used in the present embodiment, the contact portion between the recording layer 13 and the contact 40 is positioned at the end portion of the recording layer 13. Therefore, in the present embodiment, the propagation of the current spin is generated from the end of the recording layer 13 toward the whole layer.

[1-7] Seventh Embodiment

A seventh embodiment is a modification of the fifth embodiment, and is an example in which a contact to be misaligned itself is reduced. It is to be noted that in the seventh embodiment, description of respects similar to those of the other embodiments is omitted.

(Structure)

FIG. 21 shows a sectional view of a magnetic random access memory according to the seventh embodiment of the present invention. FIG. 22 shows a plan view and a sectional view in which a connecting portion between an MTJ element and the contact shown in FIG. 21 is enlarged. The magnetic random access memory according to the seventh embodiment of the present invention will hereinafter be described.

As shown in FIGS. 21 and 22, the seventh embodiment is different from the fifth embodiment in that a contact 30 to be misaligned itself is reduced. An area of this contact 30 is smaller than that of an MTJ element MTJ. It is preferable that sift S between center C2 of the contact 30 and center C1 of the MTJ element MTJ is, for example, ¼F or less of a width (e.g., a minimum processing dimension F) of the MTJ element MTJ in a short direction (a magnetization difficult-axis direction). This is because when the sift is of this degree, a disadvantage due to misalignment is not generated.

(Write Operation)

FIGS. 23A to 23D show explanatory views of a write operation of the magnetic random access memory according to the seventh embodiment of the present invention. The write operation of the magnetic random access memory according to the seventh embodiment of the present invention will hereinafter be described. It is to be noted that a case where "1" data is written in the MTJ element MTJ in which "0" data has been written will be described as an example herein.

First, it is assumed that as shown in FIG. 23A, a recording layer 13 of the MTJ element MTJ is magnetized upwards, and the magnetizations of a fixed layer 11 and the recording layer 13 have a parallel state (a "0" data state). Then, as shown in FIG. 23B, when a write current I is passed in a direction from the fixed layer 11 to the recording layer 13, the magnetization of the recording layer 13 first reverses only at a portion where the write current I (electrons) flows (a portion which comes in contact with the contact 30). The write current I is passed as it is, whereby as shown in FIG. 23C, propagation is generated in the recording layer 13 owing to current spin, and the magnetization of the recording layer 13 starts reversing in order from a contact portion of the recording layer 13 toward the whole layer. As a result, as shown in FIG. 23D, the recording layer 13 is magnetized downwards on the whole, and the magnetizations of the fixed layer 11 and the recording layer 13 have an anti-parallel state (a "1" data state).

In such a write operation, the portion where the write current I flows is an only contact portion between the recording layer 13 and the contact 30. Therefore, in the same manner as in the first embodiment, the write current I can be made low, and there is an advantage that the current flowing through the transistor Tr can be made low.

[1-8] Eighth Embodiment

An eighth embodiment is a modification of the sixth embodiment, and an example in which a contact to be misaligned itself is reduced. It is to be noted that in the eighth embodiment, description of respects similar to those of the other embodiments is omitted.

(Structure)

FIG. 24 shows a sectional view of a magnetic random access memory according to the eighth embodiment of the present invention. FIG. 25 shows a plan view and a sectional view in which a connecting portion between an MTJ element and the contact shown in FIG. 24 is enlarged. The magnetic random access memory according to the eighth embodiment of the present invention will hereinafter be described.

As shown in FIGS. 24 and 25, the eighth embodiment is different from the sixth embodiment in that a contact 40 to be misaligned itself is reduced. An area of this contact 40 is smaller than that of an MTJ element MTJ. It is preferable that sift S between center C2 of the contact 40 and center C1 of the MTJ element MTJ is, for example, ¼F or less of a width (e.g., a minimum processing dimension F) of the MTJ element MTJ in a short direction (a magnetization difficult-axis direction). This is because when the sift is of this degree, a disadvantage due to misalignment is not generated.

(Write Operation)

FIGS. 26A to 26D show explanatory views of a write operation of the magnetic random access memory according to the eighth embodiment of the present invention. The write operation of the magnetic random access memory according to the eighth embodiment of the present invention will hereinafter be described. It is to be noted that a case where "1" data is written in the MTJ element MTJ in which "0" data has been written will be described as an example herein.

First, it is assumed that as shown in FIG. 26A, a recording layer 13 of the MTJ element MTJ is magnetized downwards, and the magnetizations of a fixed layer 11 and the recording layer 13 have a parallel state (a "0" data state). Then, as shown in FIG. 26B, when a write current I is passed in a direction from the fixed layer 11 to the recording layer 13, the magnetization of the recording layer 13 first reverses only at a portion where the write current I (electrons) flows (a portion which comes in contact with the contact 40). The write current I is passed as it is, whereby as shown in FIG. 26C, propagation is generated in the recording layer 13 owing to current spin, and the magnetization of the recording layer 13 starts reversing in order from a contact portion of the recording layer 13 toward the whole layer. As a result, as shown in FIG. 26D, the recording layer 13 is magnetized upwards on the whole, and the magnetizations of the fixed layer 11 and the recording layer 13 have an anti-parallel state (a "1" data state).

In such a write operation, the portion where the write current I flows is an only contact portion between the recording layer 13 and the contact 40. Therefore, in the same manner as in the second embodiment, the write current I can be made low, and there is an advantage that the current flowing through the transistor Tr can be made low.

[1-9] Ninth Embodiment

A ninth embodiment relates to a contact positioned above an MTJ element, and is an example in which this contact is linearly formed, whereby a contact area of the contact with respect to a recording layer is set to be smaller than an area of the recording layer. It is to be noted that in the ninth embodiment, description of respects similar to those of the other embodiments is omitted.

(Structure)

FIG. 27 shows a sectional view of a magnetic random access memory according to the ninth embodiment of the present invention. FIG. 28 shows a plan view and a sectional view in which a connecting portion between an MTJ element and a contact of FIG. 27 is enlarged. The magnetic random access memory according to the ninth embodiment of the present invention will hereinafter be described.

As shown in FIGS. 27 and 28, the ninth embodiment is different from the first embodiment in a shape of a contact 30 having an area set to be smaller than that of a recording layer 13. That is, to set the contact area of the contact 30 with respect to the recording layer 13 to be smaller than the area of the recording layer 13, in the first embodiment, one thin contact 30 is formed, whereas in the ninth embodiment, two linear thin contacts 30-1, 30-2 are formed. The contacts 30-1, 30-2 are arranged away from each other, and a gap between these contacts 30-1 and 30-2 is filled up with an insulating film 24.

(Manufacturing Method)

Figure 29A:
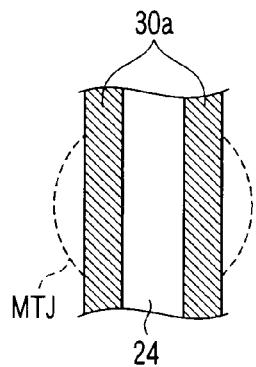
FIGS. 29A to 29C are sectional views showing manufacturing steps of the magnetic random access memory according to the ninth embodiment of the present invention.
Figure 29B:
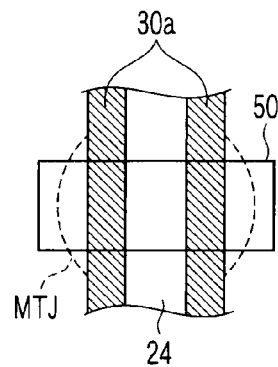
Figure 29C:
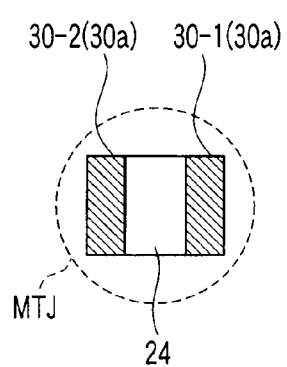

FIGS. 29A to 29C show plan views of manufacturing steps of the magnetic random access memory according to the ninth embodiment of the present invention.

Figure 30A:
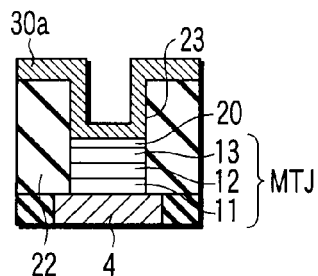
FIGS. 30A to 30C are sectional views of manufacturing steps for forming a structure of FIG. 29.
Figure 30B:
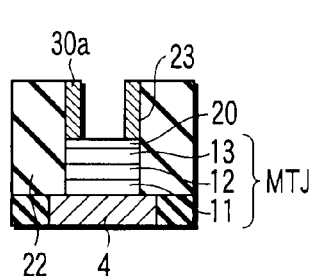
Figure 30C:
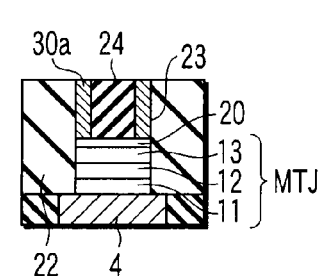
Figure 31A:
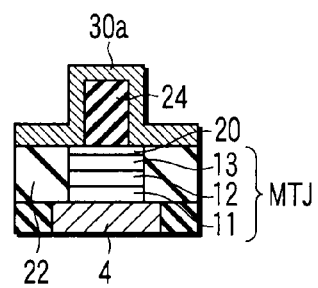
FIGS. 31A to 31C are sectional views of manufacturing steps for forming the structure of FIG. 29.
Figure 31B:
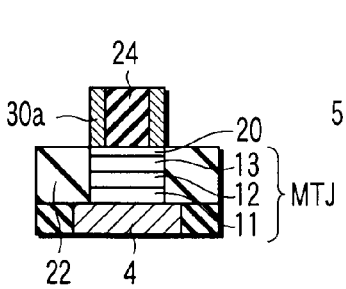
Figure 31C:
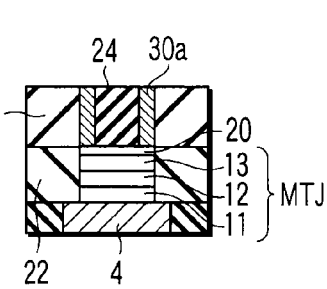

FIGS. 30A to 30C are sectional views of manufacturing steps for forming a structure of FIG. 29. FIGS. 31A to 31C are sectional views of manufacturing steps for forming the structure of FIG. 29. A manufacturing method of the magnetic random access memory according to the ninth embodiment of the present invention will hereinafter be described.

First, as shown in FIG. 29A, on an MTJ element MTJ, the linear insulating film 24 and a metal film 30a are formed. This formation is realized by, for example, the following first and second methods.

In the first method, as shown in FIG. 30A, the metal film 30a is formed in a linear groove 23. Subsequently, as shown in FIG. 30B, the metal film 30a is etched, and the metal film 30a is left only on a side surface of the groove 23. Afterward, the groove 23 is filled up with the insulating film 24. Consequently, the linear insulating film 24 and the metal film 30a are formed.

In the second method, as shown in FIG. 31A, the linear insulating film 24 is formed on a cap layer 20, and the metal film 30a is formed on this insulating film 24. Subsequently, as shown in FIG. 31B, the metal film 30a is etched so as to be left only on a side surface of the insulating film 24. Consequently, the linear insulating film 24 and the metal film 30a are formed. Afterward, as shown in FIG. 31C, a periphery of the metal film 30a is filled up with an insulating film 51.

Subsequently, as shown in FIG. 29B, a resist 50 is formed so as to cross the linear insulating film 24 and the metal film 30a.

Subsequently, as shown in FIG. 29C, the insulating film 24 and the metal film 30a are etched using the resist 50 as a mask. As a result, two linear contacts 30-1, 30-2 are formed on the MTJ element MTJ. Afterward, the resist 50 is removed.

According to such a manufacturing method of the ninth embodiment, the linear contacts 30-1, 30-2 are formed by a sidewall leaving process. Therefore, fine processing can be performed as compared with a case where the contacts are formed by lithography.

[1-10] Tenth Embodiment

A tenth embodiment is a combination of the first and second embodiments, and an example in which contacts above and under an MTJ element are reduced. It is to be noted that in the tenth embodiment, description of respects similar to those of the other embodiments is omitted.

(Structure)

Figure 32:
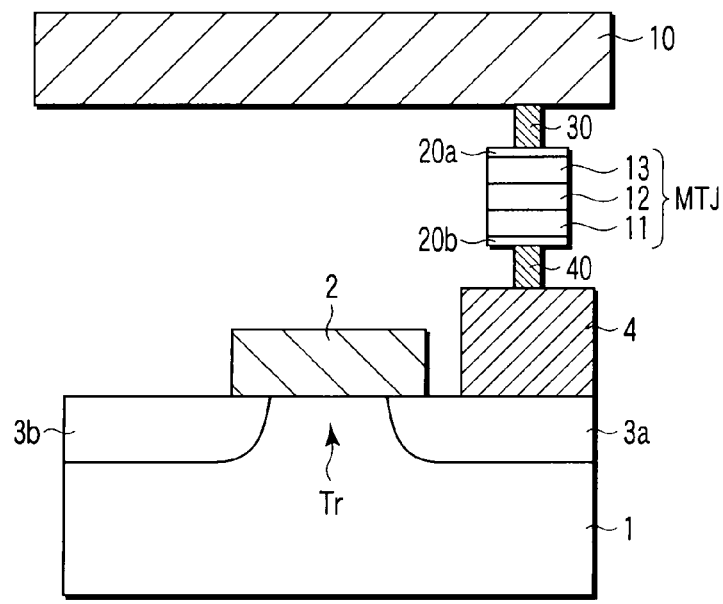
FIG. 32 is a sectional view showing a magnetic random access memory according to a tenth embodiment of the present invention.
Figure 33:
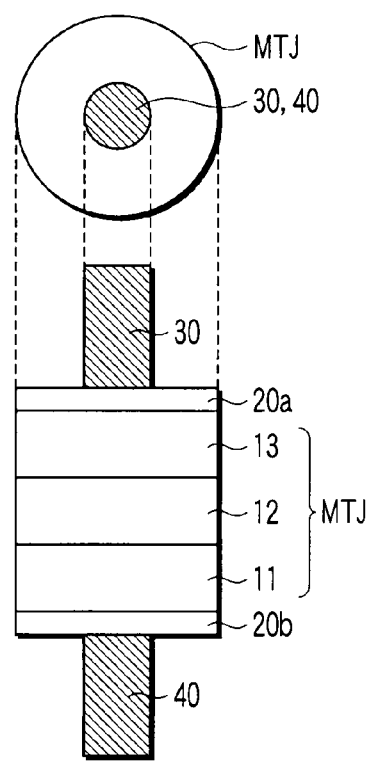
FIG. 33 shows a plan view and a sectional view in which a connecting portion between an MTJ element and a contact shown in FIG. 32 is enlarged.

FIG. 32 shows a sectional view of a magnetic random access memory according to the tenth embodiment of the present invention. FIG. 33 shows a plan view and a sectional view in which a connecting portion between the MTJ element and the contact shown in FIG. 32 is enlarged. The magnetic random access memory according to the tenth embodiment of the present invention will hereinafter be described.

As shown in FIGS. 32 and 33, a contact 30 above an MTJ element MTJ is similar to that of the first embodiment. That is, an area of a portion where the contact 30 comes in contact with a recording layer 13 via a cap layer 20a is smaller than an area of the recording layer 13. This contact 30 is positioned at the center of the MTJ element MTJ (the recording layer 13).

A contact 40 under the MTJ element MTJ is similar to that of the second embodiment. That is, an area of a portion where the contact 40 comes in contact with a fixed layer 11 via a cap layer 20b is smaller than an area of the fixed layer 11. This contact 40 is positioned at the center of the MTJ element MTJ (the fixed layer 11).

Here, in the present drawing, the fixed layer 11 is arranged on a transistor Tr side and the recording layer 13 is arranged on an interconnect 10 side, but the fixed layer 11 may be arranged on the interconnect 10 side and the recording layer 13 may be arranged on the transistor Tr side.

According to such a tenth embodiment, since the contacts 30, 40 above and under the MTJ element MTJ are small, spread of a write current I in a lateral direction is further suppressed. Therefore, a current path is further limited, and hence there is an advantage that an effect of a low current further improves.

[2] MTJ Element MTJ

[2-1] Magnetization Arrangement

In the above embodiments, an example in which the fixed layer 11 and the recording layer 13 of the MTJ element MTJ are magnetized in a vertical direction with respect to a film surface (a vertical magnetization type) has been described, but they may be magnetized in a parallel direction with respect to the film surface (a parallel magnetization type).

It is to be noted that unlike a conventional example, the vertical magnetization type of MTJ element MTJ has an advantage that the magnetization direction is not determined in accordance with a longitudinal direction of an element shape.

[2-2] Material

The MTJ element MTJ is made of, for example, the following material.

As a material of the fixed layer 11 and the recording layer 13, there is preferably used Fe, Co, Ni or an alloy thereof as well as a magnetite having large spin polarizability, an oxide such as $CrO_2$ or $RXMnO_{3-y}$ (R; rare earth metals, X; Ca, Ba or Sr), a Heusler alloy such as NiMnSb or PtMnSb, or the like. Each of these magnetic materials may contain a slight amount of a non-magnetic element such as Ag, Cu, Au, Al, Mg, Si, Bi, Ta, B, C, O, N, Pd, Pt, Zr, Ir, W, Mo or Nb, as long as ferromagnetism is not lost.

As a material of the non-magnetic layer 12, a dielectric material such as $Al_2O_3$, $SiO_2$, MgO, AlN, $Bi_2O_3$, $MgF_2$, $CaF_2$, $SrTiO_2$ or $AlLaO_3$ may be used. In these dielectric materials, an oxygen, nitrogen or fluorine deficiency may be present. It is to be noted that in the cap layer 20 of the above embodiments, the above material of the non-magnetic layer 12 may be used.

An antiferromagnetic layer for securing the magnetization direction of the fixed layer 11 may be provided on the surface of the fixed layer 11 opposite to the non-magnetic layer 12. As a material of this antiferromagnetic layer, Fe—Mn, Pt—Mn, Pt—Cr—Mn, Ni—Mn, Ir—Mn, NiO, $Fe_2O_3$ or the like may be used.

It is to be noted that examples of a vertical magnetic material for realizing the vertical magnetization type MTJ element MTJ include the followings.

First, a magnetic material having such a high coercive field strength for use in the vertical magnetic material of the fixed layer 11 and the recording layer 13 is made of a material having a high magnetic anisotropic energy density of $1 \times 10^6$ erg/cc or more. Material examples will hereinafter be described.

Example 1

"A material made of an alloy including at least one of iron (Fe), cobalt (Co) and nickel (Ni) and at least one of chromium (Cr), platinum (Pt) and palladium (Pd)"

Examples of a regular alloy include Fe(50)Pt(50), Fe(50)Pd(50) and Co(50)Pt(50). Examples of an irregular alloy include a CoCr alloy, a CoPt alloy, a CoCrPt alloy, a CoCrPtTa alloy and a CoCrNb alloy.

Example 2

"A material having a structure in which at least one of Fe, Co and Ni or an alloy including one of them and at least one of Pd and Pt or an alloy including one of them are alternately laminated"

Examples of the material include a Co/Pt artificial lattice, a Co/Pd artificial lattice and a CoCr/Pt artificial lattice. In a case where the Co/Pt artificial lattice or the Co/Pd artificial lattice is used, as a resistance change ratio (an MR ratio), a large ratio of about 40% can be realized.

Example 3

"An amorphous alloy including at least one of rare earth metals such as terbium (Tb), dysprosium (Dy) and gadolinium (Gd) and at least one of transition metals"

Examples of the alloy include TbFe, TbCo, TbFeCo, DyTbFeCo and GdTbCo.

Moreover, the recording layer 13 may be made of the above magnetic material having a high coercive field strength. Alternatively, the recording layer may be subjected to regulation of a composition ratio, addition of impurities, regulation of a thickness or the like, and made of a magnetic material having a magnetic anisotropic energy density smaller than that of the above magnetic material having the high coercive field strength. Examples of the material will hereinafter be described.

Example 1

"A material in which impurities have been added to an alloy including at least one of Fe, Co and Ni and at least one of Cr, Pt and Pd"

Examples of the material include a material in which impurities such as Cu, Cr and Ag are added to a regular alloy such as Fe(50)Pt(50), Fe(50)Pd(50) or Co(50)Pt(50) to lower a magnetic anisotropic energy density. The examples of the material also include a material in which with regard to an irregular alloy such as a CoCr alloy, a CoPt alloy, a CoCrPt alloy, a CoCrPtTa alloy or a CoCrNb alloy, a ratio of a non-magnetic element is increased to lower the magnetic anisotropic energy density.

Example 2

"A material having a structure in which at least one of Fe, Co and Ni or an alloy including one of them and at least one of Pd and Pt or an alloy including one of them are alternately laminated and in which a thickness of a layer including the former element or alloy or a thickness of a layer including the latter element or alloy is regulated"

There is an optimum thickness of at least one of Fe, Co and Ni or the alloy including one of them, and an optimum thickness of at least one of Pd and Pt or the alloy including one of them, but the magnetic anisotropic energy density gradually drops as each thickness departs from the optimum.

Example 3

"A material in which a composition ratio of an amorphous alloy including at least one of rare earth metals such as terbium (Tb), dysprosium (Dy) and gadolinium (Gd) and at least one of transition metals is regulated"

Examples of the material include a material in which a composition ratio of an amorphous alloy such as TbFe, TbCo, TbFeCo, DyTbFeCo and GdTbCo is regulated and in which the magnetic anisotropic energy density is reduced.

[2-3] Planar Shape

In the above embodiments, it has been described that a planar shape of the MTJ element MTJ is circle, but the present invention is not limited to this shape. The planar shape of the MTJ element MTJ may variously be changed to, for example, a rectangular shape, a square shape, an elliptic shape, a hexagonal shape, a rhombic shape, a parallelogram shape, a cross shape, a bean shape (a concave shape) or the like.

In the case of a parallel magnetization type of MTJ element MTJ, when shape magnetic anisotropy is used and a minimum processing dimension (F) is assumed in a short direction (a magnetization difficult-axis direction) of the MTJ element MTJ, the shape preferably has a dimension of about 2F in a longitudinal direction (a magnetization easy-axis direction).

In the case of a vertical magnetization type of MTJ element MTJ, since the magnetization direction does not depend on the shape, any of the above shapes may be used.

[2-4] Tunnel Junction Structure

The MTJ element MTJ may have a single tunnel junction structure or a double tunnel junction structure.

As shown in FIG. 1 and the like, the MTJ element MTJ with the single tunnel junction structure has a fixed layer 11, a recording layer 13, and a non-magnetic layer 12 provided between the fixed layer 11 and the recording layer 13. That is, the MTJ element MTJ has one non-magnetic layer.

The MTJ element MTJ with the double tunnel junction structure has a first fixed layer, a second fixed layer, a recording layer provided between the first fixed layer and the second fixed layer, a first non-magnetic layer provided between the first fixed layer and the recording layer, and a second non-magnetic layer provided between the second fixed layer and the recording layer. That is, the MTJ element MTJ has two non-magnetic layers.

In the double tunnel junction structure, as compared with the single tunnel junction structure, a magnetoresistive (MR) ratio (a change ratio of a resistance in a "1" or "0" state) at a time when the same external bias is applied little deteriorates, and the structure can operate with a higher bias. That is, the double tunnel junction structure is advantageous in reading data from cells.

[3] Effect

According to the above embodiments of the present invention, in the contact to be connected to at least one end portion of the MTJ element, an area of this contact which comes in contact with the recording layer is set to be smaller than that of the recording layer. Therefore, during a write operation, the magnetization reverses from a local contact portion between the contact and the MTJ element, and the magnetization reverse is propagated owing to a magnetic wall movement effect, whereby the magnetization of the whole element reverses. Therefore, a current which flows through the MTJ element during the write operation can be reduced. Furthermore, the cap layer having a resistance higher than that of the recording layer is provided, so that reduction of an effect due to current dispersion can be prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   a magnetoresistive effect element which includes a fixed layer having a fixed magnetization direction, a recording layer having a reversible magnetization direction and a non-magnetic layer provided between the fixed layer and the recording layer and in which the magnetization directions of the fixed layer and the recording layer are brought into a parallel state or an anti-parallel state in accordance with a direction of a current flowing between the fixed layer and the recording layer;
   a first contact which is connected to the recording layer and in which a contact area between the recording layer and the first contact is smaller than an area of the recording layer; and
   a cap layer which is provided between the first contact and the recording layer and which directly comes in contact with the first contact and which has a resistance higher than a resistance of the recording layer;
   wherein an area of the first contact is equal to an area of the magnetoresistive effect element, and
   a center of the first contact shifts from a center of the magnetoresistive effect element, the contact area between the first contact and the recording layer is reduced.

2. The memory according to claim 1, wherein during a write operation, magnetization of the recording layer reverses from a portion where the first contact comes in contact with the recording layer, and the whole magnetization of the recording layer reverses owing to propagation of the magnetization reverse.

* * * * *